United States Patent
Pan et al.

(10) Patent No.: US 11,328,963 B2
(45) Date of Patent: May 10, 2022

(54) MULTI-GATE DEVICE AND RELATED METHODS

(71) Applicant: Taiwan Semiconductor Manufacturing Co., Ltd., Hsinchu (TW)

(72) Inventors: Kuan-Ting Pan, Taipei (TW); Huan-Chieh Su, Changhua County (TW); Zhi-Chang Lin, Hsinchu County (TW); Shi Ning Ju, Hsinchu (TW); Yi-Ruei Jhan, Keelung (TW); Kuo-Cheng Chiang, Hsinchu County (TW); Chih-Hao Wang, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/947,398

(22) Filed: Jul. 30, 2020

(65) Prior Publication Data
US 2021/0272856 A1 Sep. 2, 2021

Related U.S. Application Data

(60) Provisional application No. 62/982,329, filed on Feb. 27, 2020.

(51) Int. Cl.
*H01L 21/8238* (2006.01)
*H01L 27/092* (2006.01)
(Continued)

(52) U.S. Cl.
CPC ........... *H01L 21/823878* (2013.01); *H01L 21/02603* (2013.01); *H01L 21/31111* (2013.01);
(Continued)

(58) Field of Classification Search
CPC ....... H01L 21/823878; H01L 21/02603; H01L 21/31111; H01L 21/823807; H01L 21/823814; H01L 21/823871; H01L 27/092; H01L 29/0649; H01L 29/0673; H01L 29/41733; H01L 29/42392;
(Continued)

(56) References Cited

U.S. PATENT DOCUMENTS 8,796,666 B1 8/2014 Huang et al.
8,815,712 B2 8/2014 Wan et al.
(Continued)

*Primary Examiner* — Tong-Ho Kim
(74) *Attorney, Agent, or Firm* — Haynes and Boone, LLP

(57) ABSTRACT

A method of fabricating a device includes forming a dummy gate over a plurality of fins. Thereafter, a first portion of the dummy gate is removed to form a first trench that exposes a first hybrid fin and a first part of a second hybrid fin. The method further includes filling the first trench with a dielectric material disposed over the first hybrid fin and over the first part of the second hybrid fin. Thereafter, a second portion of the dummy gate is removed to form a second trench and the second trench is filled with a metal layer. The method further includes etching-back the metal layer, where a first plane defined by a first top surface of the metal layer is disposed beneath a second plane defined by a second top surface of a second part of the second hybrid fin after the etching-back the metal layer.

20 Claims, 19 Drawing Sheets

(51) Int. Cl.
*H01L 29/06* (2006.01)
*H01L 29/417* (2006.01)
*H01L 29/423* (2006.01)
*H01L 29/786* (2006.01)
*H01L 29/66* (2006.01)
*H01L 21/02* (2006.01)
*H01L 21/311* (2006.01)

(52) U.S. Cl.
CPC ........... *H01L 21/823807* (2013.01); *H01L 21/823814* (2013.01); *H01L 21/823871* (2013.01); *H01L 27/092* (2013.01); *H01L 29/0649* (2013.01); *H01L 29/0673* (2013.01); *H01L 29/41733* (2013.01); *H01L 29/42392* (2013.01); *H01L 29/66515* (2013.01); *H01L 29/66545* (2013.01); *H01L 29/66636* (2013.01); *H01L 29/66742* (2013.01); *H01L 29/78603* (2013.01); *H01L 29/78618* (2013.01); *H01L 29/78696* (2013.01)

(58) Field of Classification Search
CPC ......... H01L 29/66515; H01L 29/66545; H01L 29/66636; H01L 29/66742; H01L 29/78603; H01L 29/78618; H01L 29/78696

USPC ....................................................... 257/351
See application file for complete search history.

(56) References Cited

U.S. PATENT DOCUMENTS

| | | |
|---|---|---|
| 8,963,258 B2 | 2/2015 | Yu et al. |
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,576,814 B2 | 2/2017 | Wu et al. |
| 2013/0285116 A1 | 10/2013 | Lochtefeld et al. |
| 2020/0105581 A1* | 4/2020 | Chang ................ H01L 27/0886 |
| 2020/0127113 A1* | 4/2020 | Ching .................... H01L 29/511 |
| 2020/0243665 A1* | 7/2020 | Ching ............... H01L 21/76876 |
| 2021/0098466 A1* | 4/2021 | Liaw ............... H01L 21/823821 |

* cited by examiner

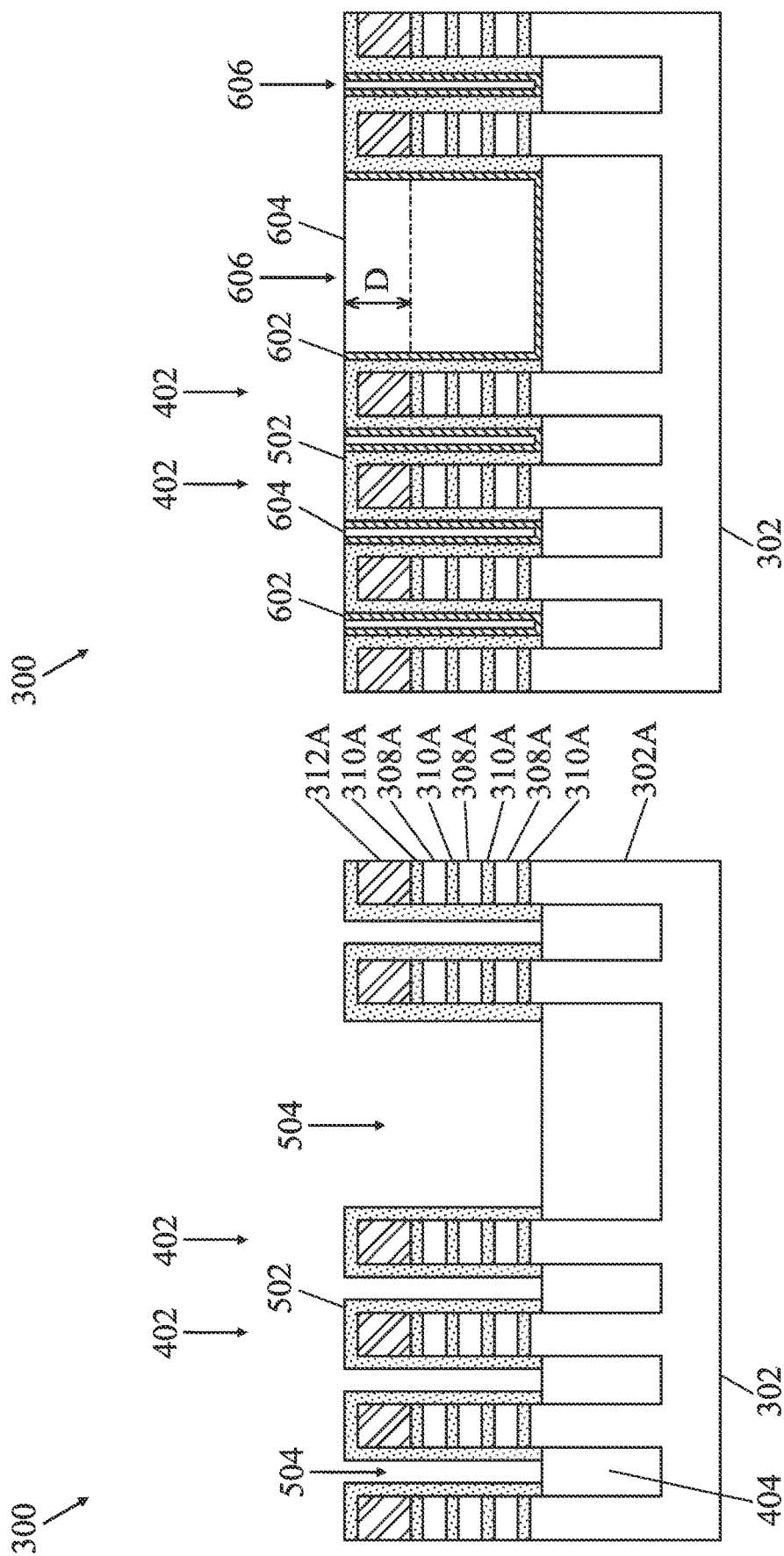

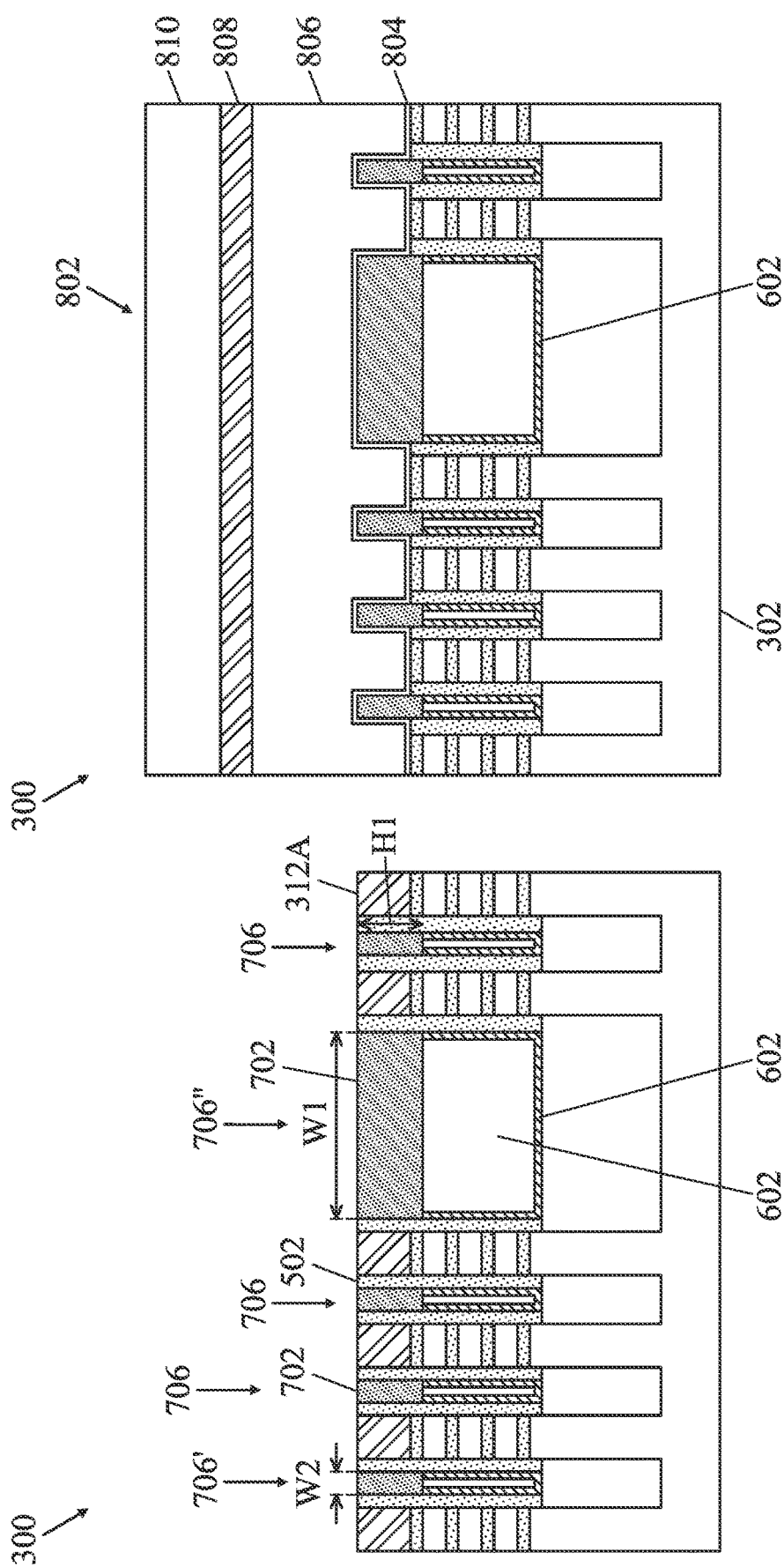

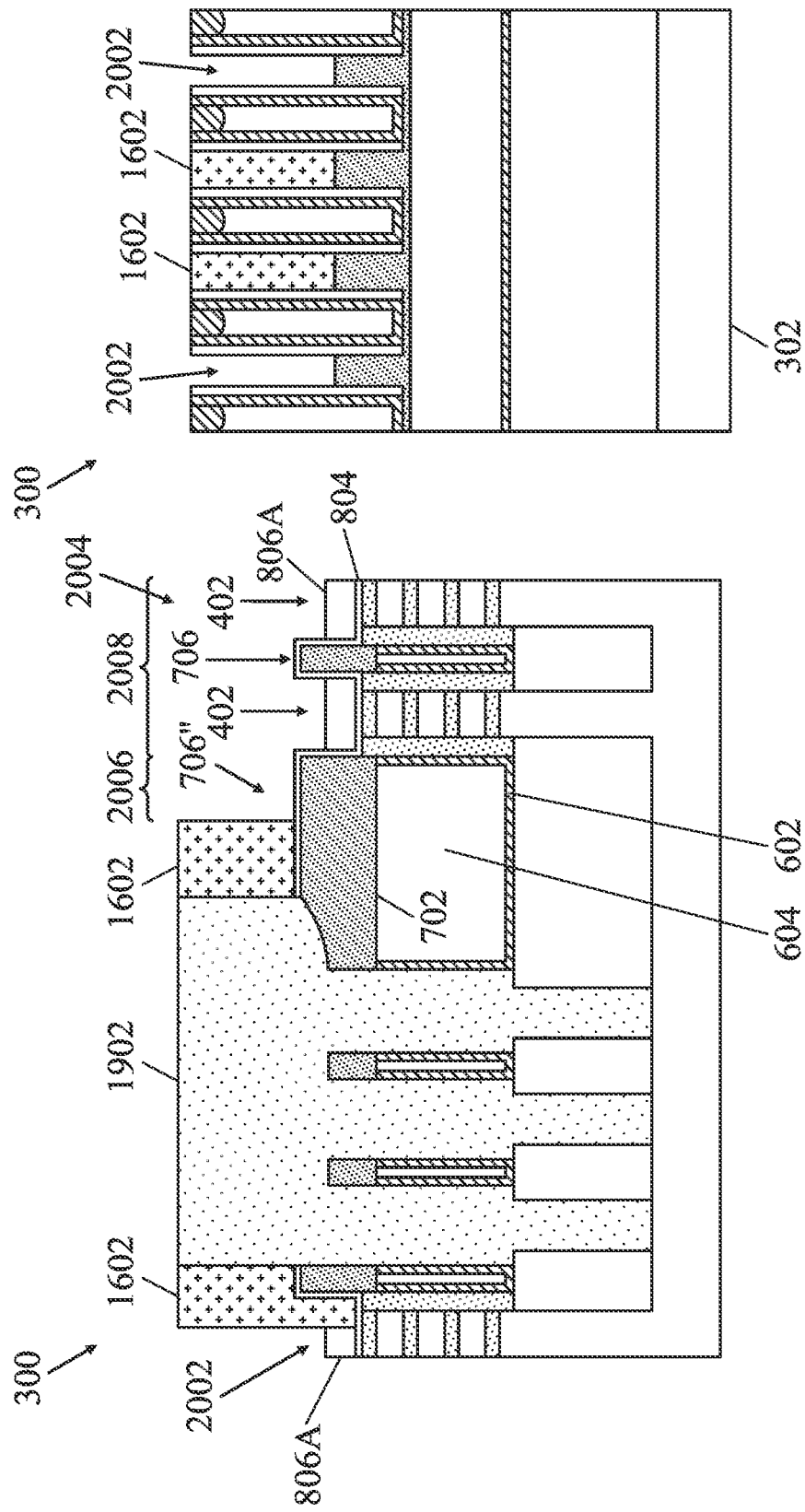

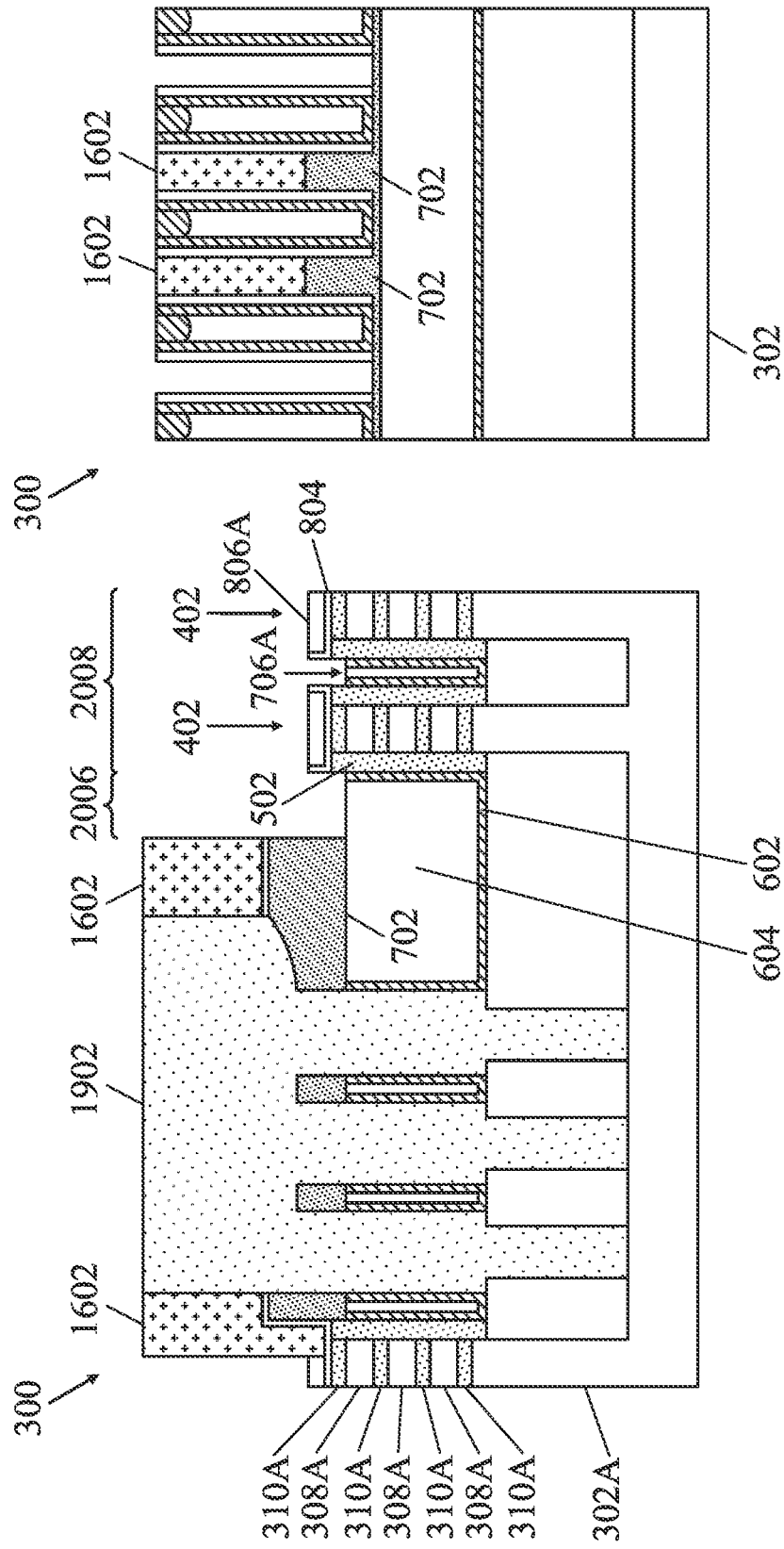

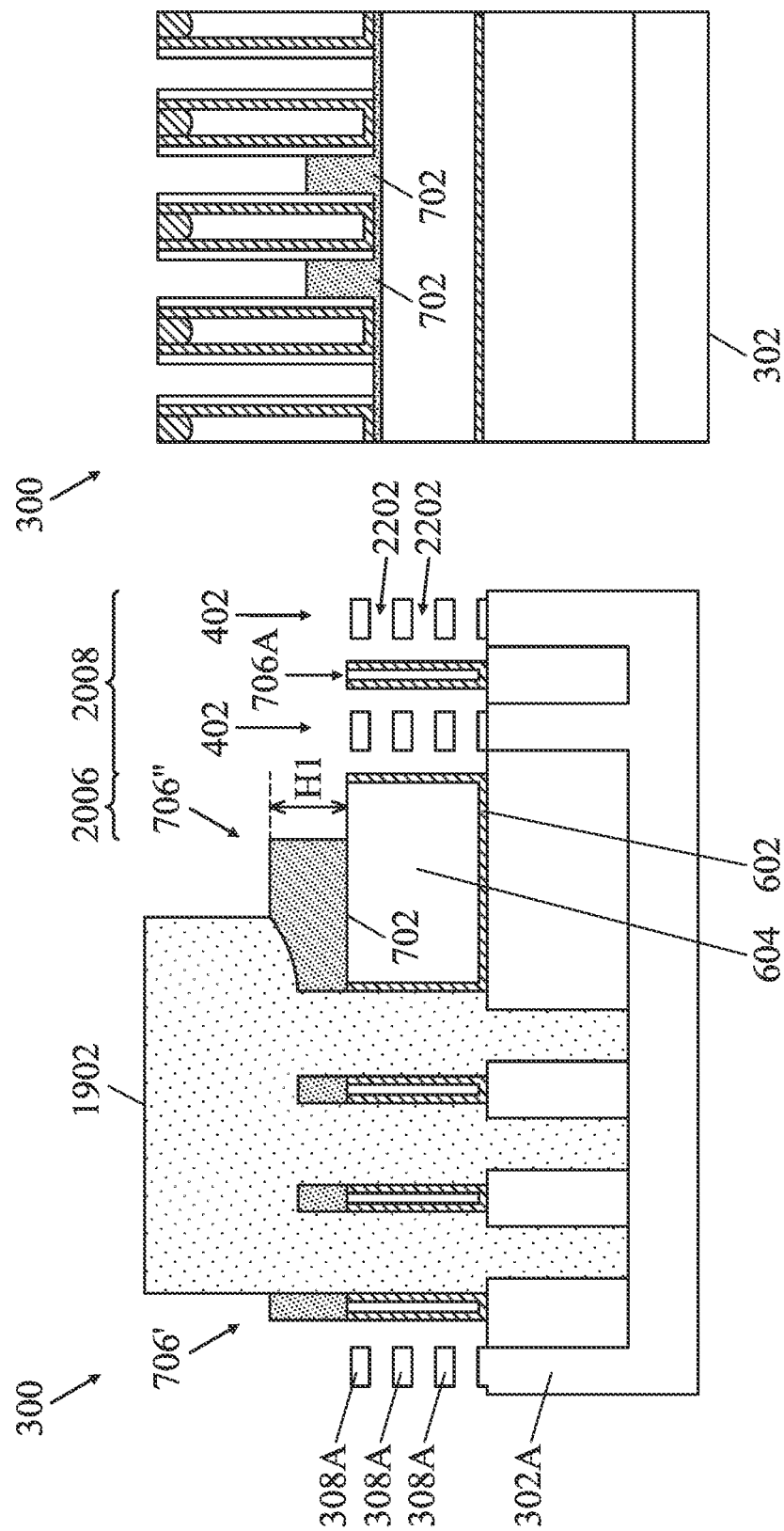

MULTI-GATE DEVICE AND RELATED METHODS

CROSS-REFERENCE TO RELATED APPLICATION

This application claims the benefit of U.S. Provisional Application No. 62/982,329, filed Feb. 27, 2020, the entirety of which is incorporated by reference herein.

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. Another multi-gate device, introduced in part to address performance challenges associated with FinFETs, is the gate-all-around (GAA) transistor. GAA devices get their name from the gate structure which extends completely around the channel, providing better electrostatic control than FinFETs. FinFETs and GAA devices are compatible with conventional complementary metal-oxide-semiconductor (CMOS) processes and their three-dimensional structure allows them to be aggressively scaled while maintaining gate control and mitigating SCEs.

To continue to provide the desired scaling and increased density for multi-gate devices (e.g., FinFETs and GAA devices) in advanced technology nodes, continued reduction of the cell height and the contacted poly pitch (CPP) (or "gate pitch") is necessary. In at least some existing implementations, a cut metal gate (CMG) region, formed as part of a metal gate isolation process, is defined using a photolithography process and can result in poor pattern alignment (e.g., overlay control) and degraded critical dimension uniformity (CDU). Similarly, at least some existing implementations utilize a photolithography process to perform an active region (OD) isolation process, which can limit device scaling. As a result, cell height and CPP scaling has remained a challenge. Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3, 4, 5, 6, 7, 8, 14A, 15A, 16A, 17A, 18A, 19A, 20A, 21A, 22A, 23A, and 24A provide cross-sectional views of some embodiments of a semiconductor device fabricated according to the method of FIG. 2, along a plane substantially parallel to a plane defined by section CC' of FIG. 1;

FIGS. 14B, 15B, 16B, 17B, 18B, 19B, 20B, 21B, 22B, 23B, and 24B provide cross-sectional views of some embodiments of a semiconductor device fabricated according to the method of FIG. 2, along a plane substantially parallel to a plane defined by section BB' of FIG. 1.

DETAILED DESCRIPTION

Figure 1:
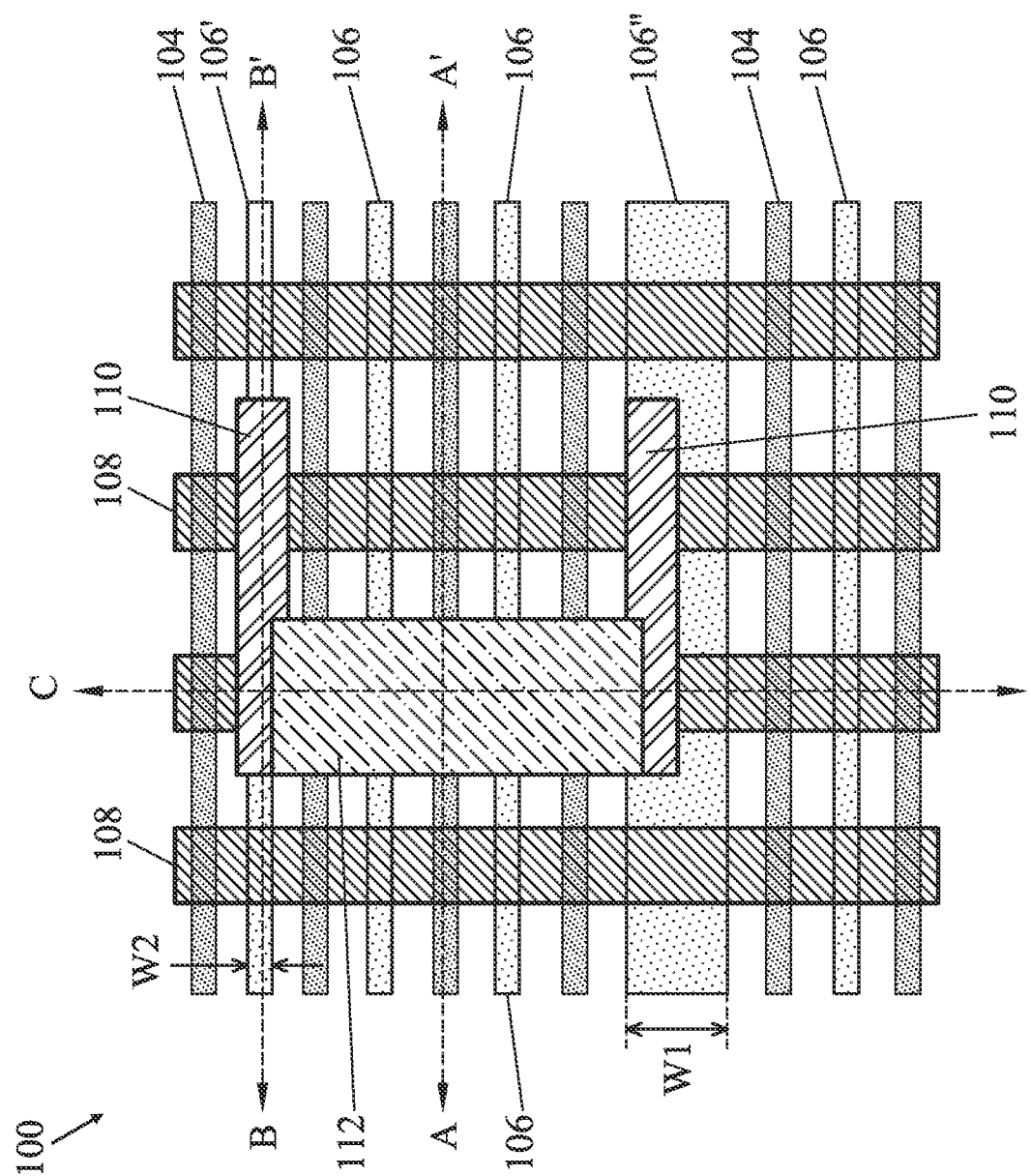
FIG. 1 provides a simplified top-down layout view of a multi-gate device 100, in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors. Multi-gate transistors include those transistors whose gate structures are formed on at least two-sides of a channel region. These multi-gate devices may include a P-type metal-oxide-semiconductor device or an N-type metal-oxide-semiconductor multi-gate device. Specific examples may be presented and referred to herein as FinFETs, on account of their fin-like structure. Also presented herein are embodiments of a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanosheet channel(s), nanowire channel(s), bar-shaped channel(s), and/or other suitable channel configurations. Presented herein are embodiments of devices that may have one or more channel regions (e.g., nanowires/nanosheets) associated with a single, contiguous gate structure. However, one of ordinary skill would recognize that the teaching can apply to a single channel (e.g., single nanowire/nanosheet) or any number of channels. One of ordinary skill may recognize other examples of semiconductor devices that may benefit from aspects of the present disclosure.

Continuing to provide the desired scaling and increased density for multi-gate devices (e.g., FinFETs and GAA devices) in advanced technology nodes calls for scaling of the cell height and the contacted poly pitch (CPP) (or "gate pitch"). In some cases, cell height may refer to a layout height of a standard cell (e.g., functional cell) or a filler cell, and CPP may be described as the distance between adjacent gate structures. Generally, it is desirable to scale down the cell height and CPP to improve device performance and to increase device density. In at least some existing implementations, a cut metal gate (CMG) region, formed over a hybrid fin as part of a metal gate isolation process, is defined using a photolithography process and can result in poor pattern alignment (e.g., overlay control) and degraded critical dimension uniformity (CDU). Similarly, at least some existing implementations utilize a photolithography process to perform an active region (OD) isolation process, which can limit CPP scaling. For purposes of this disclosure, an active region includes a region where transistor structures are formed (e.g., including source, drain, and gate/channel structures). In some examples, an active region isolation process may provide isolation between neighboring active regions, and thus neighboring transistors. In particular, and as a result of the processes employed in at least some existing implementations, cell height and CPP scaling has remained a challenge. Thus, existing techniques have not proved entirely satisfactory in all respects.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures for providing a self-aligned active region (OD) and self-aligned metal gate (MG) isolation scheme (also referred to as CMG isolation) to achieve extreme density scaling. In some embodiments, and because the disclosed CMG isolation process is self-aligned, the poor alignment and degraded CDU issues noted above can be overcome, thereby providing for improved cell height scaling. In some embodiments, the cell height may be scaled down to a range of between about 20-40 nm. In various examples, the disclosed self-aligned active region isolation process also serves to overcome barriers of at least some existing implementations, providing for improved CPP scaling and improved isolation. In some embodiments, CPP may be scaled down to a range of between about 10-100 nm.

In some embodiments, the disclosed structures include a dielectric layer as part of an active region (OD) isolation. In some examples, the dielectric layer may interpose a plurality of dielectric hybrid fins formed within the active region isolation. By way of example, the dielectric layer may include SiN, SiCN, SiOCN, SiON, or a combination thereof. In some embodiments, the disclosed structures also include dielectric hybrid fins having a high-κ dielectric top portion for self-aligned metal gate isolation (CMG isolation) and for self-aligned active region isolation. In some cases, a height of the high-κ dielectric top portion of the dielectric hybrid fin may be about 10-30 nm. In some embodiments, the dielectric material of the high-κ dielectric top portion may include $HfO_2$, $ZrO_2$, HfAlOx, HfSiOx, $Al_2O_3$, or other appropriate material. In some embodiments, the dielectric hybrid fin may include a bi-layer dielectric material, where the upper part is a high-κ dielectric portion, and the lower part is a low-κ dielectric portion. In some embodiments, the dielectric material for the low-κ dielectric portion may include SiN, SiCN, SiOC, SiOCN, SiON, or other appropriate material. In some cases, the device may also include the dielectric hybrid fin (having the high-κ dielectric top portion) disposed within an active region (OD) isolation area, where the high-κ dielectric top portion of such dielectric hybrid fins is shorter (e.g., due to height loss), for example, than hybrid dielectric fins outside the active region isolation area. In some embodiments, the height loss of the high-κ dielectric top portion within the active region isolation area may be greater than about 2 nm. In some examples, the height loss of the high-κ dielectric top portion within the active region isolation area may be due to an active region isolation etch process, which may recess the high-κ dielectric top portion by greater than about 2 nm. In various examples, there is no high-κ dielectric top portion in a gate connection region, but only a low-κ dielectric hybrid fin (e.g., including SiN, SiCN, SiOC, SiOCN, SiON, or other appropriate material). By employing the disclosed embodiments for providing a self-aligned active region and a self-aligned CMG isolation scheme, CPP and cell height may be scaled down to provide increased device density, device isolation may be improved, and device performance is enhanced. Other embodiments and advantages will be evident to those skilled in the art upon reading the present disclosure.

For purposes of the discussion that follows, FIG. 1 provides a simplified top-down layout view of a multi-gate device 100, in accordance with various embodiments. In some embodiments, the multi-gate device 100 may include FinFETs, GAA transistors, or other types of multi-gate devices. The multi-gate device 100 may include a plurality of fin elements 104 extending from a substrate, a plurality of hybrid fins 106, 106', 106'', gate structures 108, cut metal gate (CMG) regions 110 that provide isolation between metal layers of adjacent structures (e.g., on either side of the CMG regions 110), and an active region isolation area 112 that provides isolation between neighboring active regions (e.g., such as regions on either side of the active region isolation area 112). Each one of the CMG regions 110 overlaps one or multiple gate structures 108. Channel regions of the multi-gate device 100, which may include a plurality of semiconductor channel layers (e.g., when the multi-gate device 100 includes a GAA transistor), are disposed within the fins 104, underlying the gate structures 108, along a plane substantially parallel to a plane defined by section AA' of FIG. 1. In some embodiments, source/drain regions may also be formed in contact with opposing ends of the channel regions of the fins 104. In some embodiments, sidewall spacers may also be formed on sidewalls of the gate structures 108. In addition, and in some cases, the CMG regions 110 may overlap opposing ends of the active region isolation area 112. In some embodiments, the CMG region 110 overlapping a first end of the active region isolation area 112 may also overlap, and be oriented parallel to, the hybrid fin 106' having a width 'W2'. Further, the CMG region 110 overlapping a second end of the active region isolation area 112 may also overlap, and be oriented parallel to, the hybrid fin 106'' having a width 'W1', where the width 'W1' is greater than the width 'W2'. In some cases, the remaining hybrid fins 106 may also have the width 'W2'. In some cases, the hybrid fin 106' and the hybrid fin 106" at the opposing ends of the active region isolation area 112 have substantially the same width. In some embodiments, the CMG region 110 aligns with the opposing ends of the active region isolation area 112. However, other configurations of widths for each of the hybrid fins 106, 106', and 106" are possible. Various other features of the multi-gate device 100 are discussed in more detail below with reference to the method of FIG. 2.

Figure 2:
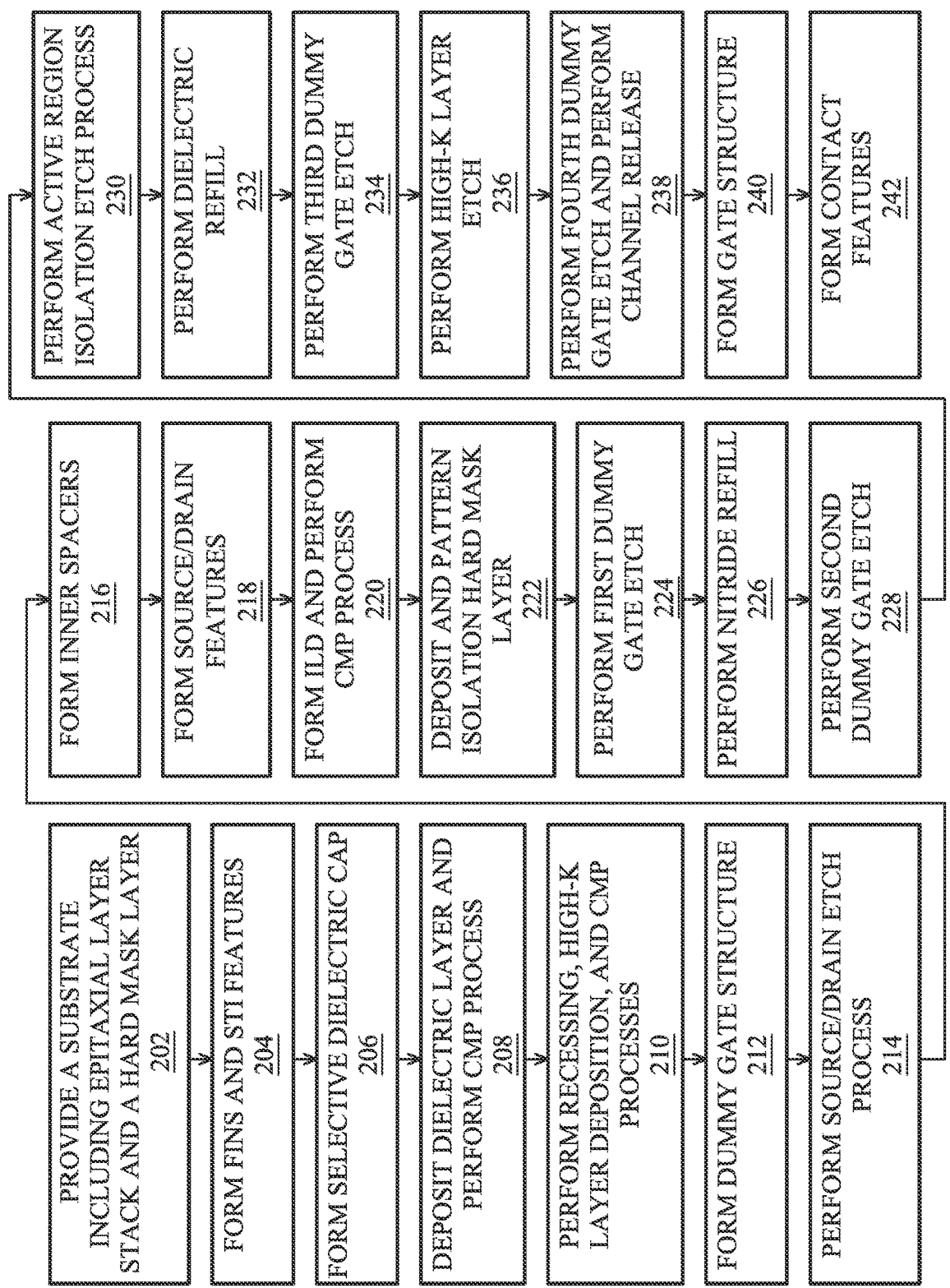
FIG. 2 is a flow chart of a method of fabricating a multi-gate device, according to some embodiments.
Figures 3, 4:
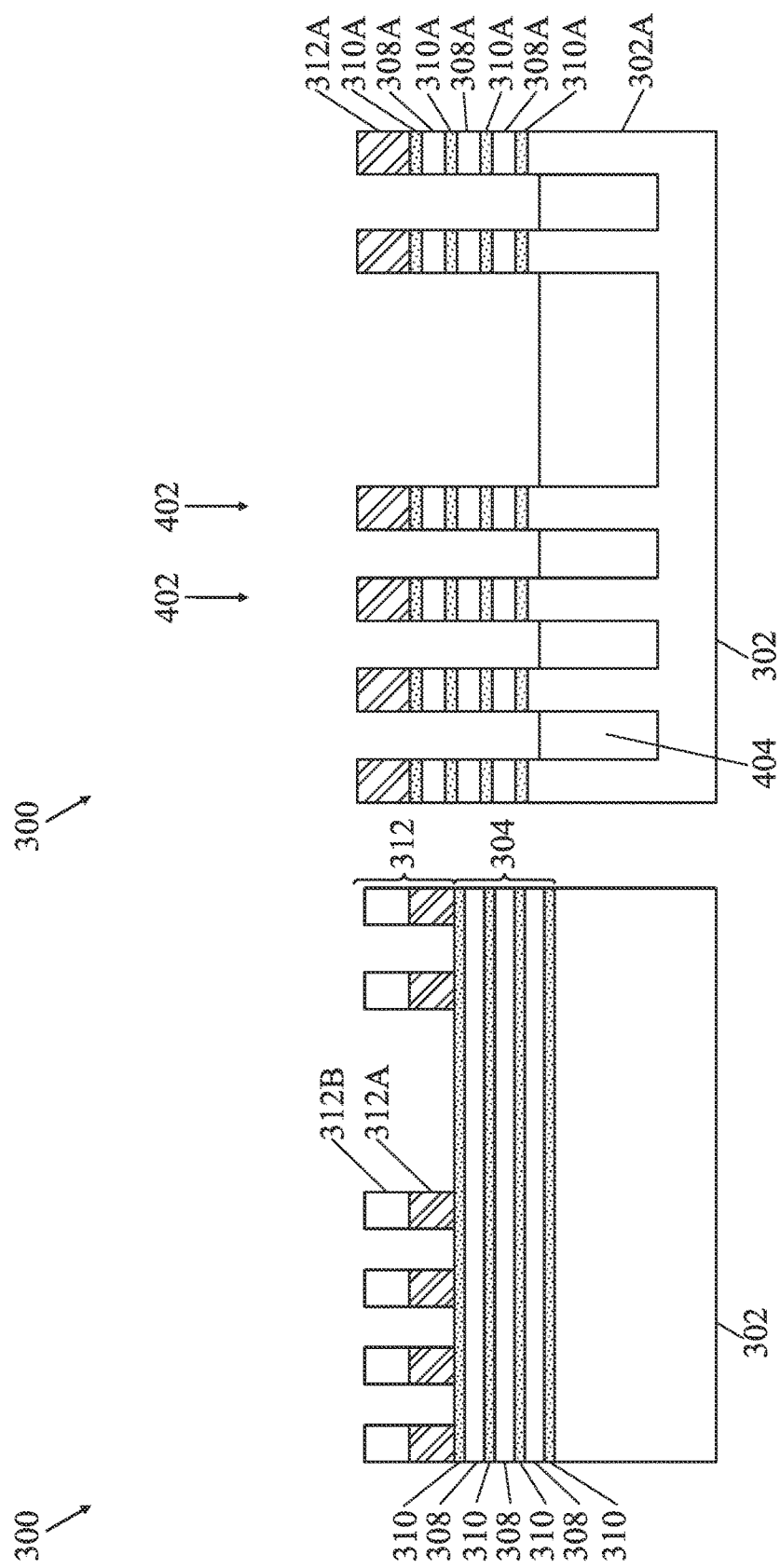

Illustrated in FIG. 2 is a method 200 of semiconductor fabrication of a semiconductor device 300 including fabrication of multi-gate devices utilizing a self-aligned active region (OD) and self-aligned metal gate (MG) isolation scheme, in accordance with various embodiments. As discussed above, multi-gate devices may include FinFETs, GAA devices, or other devices having gate structures formed on at least two-sides of a channel region and may include devices having channel regions formed as nanosheet channel(s), nanowire channel(s), bar-shaped channel(s), and/or other suitable channel configurations. The method 200 is discussed below with reference to a GAA device having a channel region that may be referred to as a nanowire and/or nanosheet and which may include various geometries (e.g., cylindrical, bar-shaped) and dimensions. However, it will be understood that aspects of the method 200, including the disclosed self-aligned active region and self-aligned MG isolation scheme, may be equally applied to other types of multi-gate devices (e.g., such as FinFETs or devices including both GAA devices and FinFETs) without departing from the scope of the present disclosure. It is understood that the method 200 includes steps having features of a complementary metal-oxide-semiconductor (CMOS) technology process flow and thus, are only described briefly herein. Also, additional steps may be performed before, after, and/or during the method 200.

The method 200 is described with reference to various figures which illustrate different views of exemplary embodiments of the semiconductor device 300 according to various stages of the method 200 of FIG. 2. For example, FIGS. 3, 4, 5, 6, 7, 8, 14A, 15A, 16A, 17A, 18A, 19A, 20A, 21A, 22A, 23A, and 24A provide cross-sectional views of an embodiment of the semiconductor device 300 along a plane substantially parallel to a plane defined by section CC' of FIG. 1. FIGS. 9, 10, 11, 12, and 13 are isometric views of an embodiment of the semiconductor device 200 according to various stages of the method 200 of FIG. 2. FIGS. 14B, 15B, 16B, 17B, 18B, 19B, 20B, 21B, 22B, 23B, and 24B provide cross-sectional views of an embodiment of the semiconductor device 300 along a plane substantially parallel to a plane defined by section BB' of FIG. 1.

Further, the semiconductor device 300 may include various other devices and features, such as other types of devices such as additional transistors, bipolar junction transistors, resistors, capacitors, inductors, diodes, fuses, static random-access memory (SRAM) and/or other logic circuits, etc., but is simplified for a better understanding of the inventive concepts of the present disclosure. In some embodiments, the semiconductor device 300 includes a plurality of semiconductor devices (e.g., transistors), including PFETs, NFETs, etc., which may be interconnected. Moreover, it is noted that the process steps of the method 200, including any descriptions given with reference to the figures are merely exemplary and are not intended to be limiting beyond what is specifically recited in the claims that follow.

The method 200 begins at block 202 where a substrate including an epitaxial layer stack and a hard mask (HM) layer is provided. Referring to the example of FIG. 3, in an embodiment of block 202, a substrate 302 including an epitaxial layer stack 304 is provided. In some embodiments, the substrate 302 may be a semiconductor substrate such as a silicon substrate. The substrate 302 may include various layers, including conductive or insulating layers formed on a semiconductor substrate. The substrate 302 may include various doping configurations depending on design requirements as is known in the art. The substrate 302 may also include other semiconductors such as germanium, silicon carbide (SiC), silicon germanium (SiGe), or diamond. Alternatively, the substrate 302 may include a compound semiconductor and/or an alloy semiconductor. Further, the substrate 302 may optionally include an epitaxial layer (epi-layer), may be strained for performance enhancement, may include a silicon-on-insulator (SOI) structure, and/or have other suitable enhancement features.

In some embodiments, the epitaxial layer stack 304 includes epitaxial layers 310 having a first composition interposed by epitaxial layers 308 having a second composition. In an embodiment, the epitaxial layers 310 having the first composition are SiGe and the epitaxial layers 308 having the second composition are silicon (Si). However, other embodiments are possible including those that provide for a first composition and a second composition having different oxidation rates and/or etch selectivity. For example, in some embodiments, either of the epitaxial layers 308, 310 of the first composition or the second composition may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. By way of example, epitaxial growth of the epitaxial layers 308, 310 of the first composition or the second composition may be performed by a molecular beam epitaxy (MBE) process, a metalorganic chemical vapor deposition (MOCVD) process, and/or other suitable epitaxial growth processes. It is also noted that while the epitaxial layers 308, 310 are shown as having a particular stacking sequence, where an epitaxial layer 310 is the topmost layer of the epitaxial layer stack 304, other configurations are possible. For example, in some cases, an epitaxial layer 308 may alternatively be the topmost layer of the epitaxial layer stack 304. Stated another way, the order of growth for the epitaxial layers 308, 310, and thus their stacking sequence, may be switched or otherwise be different than what is shown in the figures, while remaining within the scope of the present disclosure.

After forming the epitaxial layer stack 304, a hard mask (HM) layer may be formed over the device 300, where the HM layer may be patterned (e.g., using lithography and etching processes) to form a patterned HM layer 312. The patterned HM layer 312 may, in various examples, define a pattern used for subsequent formation of active fins and hybrid fins, as discussed below. In some embodiments, the patterned HM layer 312 includes a nitride layer 312A (e.g., a pad nitride layer that may include $Si_3N_4$) and an oxide layer 312B (e.g., a pad oxide layer that may include $SiO_2$) formed over the nitride layer 312A. In some examples, the oxide layer 312B may include thermally grown oxide, CVD-deposited oxide, and/or ALD-deposited oxide, and the nitride layer 312A may include a nitride layer deposited by CVD or other suitable technique. Generally, in some embodiments, the patterned HM layer 312 may include a nitride-containing material deposited by CVD, ALD, PVD, or other suitable process.

After forming the patterned HM layer 312, the method 200 proceeds to block 204 where fins and shallow trench isolation (STI) features are formed. Referring to the example of FIGS. 3 and 4, in an embodiment of block 204, fins 402 may be fabricated by etching the epitaxial layer stack 304 and the substrate 302, using the patterned HM layer 312 as a masking element. In various examples, the masking element (e.g., the patterned HM layer 312) may be used to protect regions of the substrate 302, and layers formed thereupon, while an etch process forms trenches in unprotected regions through the through the epitaxial layer stack 304, and into the substrate 302, thereby leaving the plurality of fins 402 extending from the substrate 302. In some embodiments, the fins 402 may be referred to as active fins. The trenches may be etched using a dry etch (e.g., reactive ion etching), a wet etch, and/or other suitable processes.

In various embodiments, each of the fins 402 includes a substrate portion 302A formed from the substrate 302, epitaxial layer portions 310A formed from the epitaxial layers 310, epitaxial layer portions 308A formed from the epitaxial layers 308, and the patterned HM layer 312 including the nitride layer 312A. In some embodiments, the oxide layer 312B of the patterned HM layer 312 may be removed (e.g., by a CMP process) prior to and/or during formation of the fins 402. In various embodiments, the epitaxial layer portions 308A, or portions thereof, may form a channel region of a GAA transistor of the device 300. For example, the epitaxial layer portions 308A may be referred to as nanosheets or nanowires that are used to form a channel region of a GAA device. These nanosheets or nanowires may also be used to form portions of the source/drain features of the GAA device, as discussed below. In embodiments where a FinFET is formed, each of the fins 402 may alternatively include an epitaxial layer of a uniform composition formed over the substrate portion, or each of the fins 402 may include a portion of the patterned substrate without an additional epitaxial layer formed over the substrate portion.

It is noted that while the fins 402 are illustrated as including four (4) layers of the epitaxial layer portions 310A and three (3) layers of the epitaxial layer portions 308A, this is for illustrative purposes only and not intended to be limiting beyond what is specifically recited in the claims. It can be appreciated that any number of epitaxial layers can be formed, where for example, the number of epitaxial layers depends on the desired number of channels regions for the GAA device. In some embodiments, the number of epitaxial layer portions 308A is between 4 and 10.

In some embodiments, the epitaxial layer portions 310A have a thickness range of about 6-15 nanometers (nm). In some cases, the epitaxial layer portions 308A have a thickness range of about 4-8 nm. As noted above, the epitaxial layer portions 308A may serve as channel region(s) for a subsequently-formed multi-gate device (e.g., a GAA device) and its thickness may be chosen based on device performance considerations. The epitaxial layer portions 310A may serve to define a gap distance between adjacent channel region(s) for the subsequently-formed multi-gate device and its thickness may also be chosen based on device performance considerations.

After forming the fins 402, and in a further embodiment of block 204, the trenches interposing the fins 402 may be filled with a dielectric material to form STI features interposing the fins 402, where the STI features are subsequently recessed to form the STI features 404. In some examples, the recessing to form the STI features 404 may expose portions of the nitride layer 312A, sidewalls of the epitaxial layer portions 308A, sidewalls of the epitaxial layer portions 310A, and a portion of sidewalls of the substrate portions 302A. In some embodiments, the dielectric material used to fill the trenches, and thus the STI features 404, may include $SiO_2$, silicon nitride, silicon oxynitride, fluorine-doped silicate glass (FSG), a low-κ dielectric, combinations thereof, and/or other suitable materials known in the art. In various examples, the dielectric material may be deposited by a CVD process, a subatmospheric CVD (SACVD) process, a flowable CVD process, an ALD process, a PVD process, and/or other suitable process.

The method 200 then proceeds to block 206 where a selective dielectric cap layer is formed. Referring to the example of FIGS. 4 and 5, in an embodiment of block 206, a dielectric cap layer 502 is selectively deposited over the device 300. In particular, the dielectric cap layer 502 may be selectively and conformally deposited over the fins 402 including over top and sidewall portions of the nitride layer 312A, over sidewalls of the epitaxial layer portions 308A, over sidewalls of the epitaxial layer portions 310A, and over a portion of sidewalls of the substrate portions 302A (if exposed). However, the dielectric cap layer 502 may not be deposited on a top surface of the STI features 404 disposed between the fins 402. In some embodiments, deposition of the dielectric cap layer 502 results in formation of trenches 504 interposing adjacent fins 402. In some examples, the dielectric cap layer 502 may include SiGe. Alternatively, in some cases, the dielectric cap layer 502 may include SiN, SiCN, SiOCN, or other appropriate material. By way of example, the dielectric cap layer 502 may be deposited by an MBE process, an MOCVD process, an ALD process, and/or other suitable epitaxial growth processes. In various embodiments, the dielectric cap layer 502 is a sacrificial layer that is removed at a subsequent processing stage, as described below.

The method 200 then proceeds to block 208 where a dielectric layer is deposited, and a CMP process is performed. Referring to the example of FIGS. 5 and 6, in an embodiment of block 208, a dielectric layer 602 is deposited conformally within the trenches 504 including along sidewalls of the dielectric cap layer 502 and along a top surface of the STI features 404. Thereafter, a dielectric layer 604 is deposited over the dielectric layer 602. In at least some embodiments, the dielectric layers 602, 604 may collectively define a hybrid fin 606. However, in some cases, a hybrid fin may further include a high-κ dielectric layer formed over the dielectric layers 602, 604, for example after recessing of the dielectric layers 602, 604, as discussed below. Generally, and in some embodiments, the dielectric layers 602, 604 may include SiN, SiCN, SiOC, SiOCN, SiOx, or other appropriate material. In some examples, the dielectric layer 602 may include a low-κ dielectric layer, and the dielectric layer 604 may include a flowable oxide layer. In various cases, the dielectric layers 602, 604 may be deposited by a CVD process, an ALD process, a PVD process, a spin-coating and baking process, and/or other suitable process. In some examples, after depositing the dielectric layers 602, 604, a CMP process may be performed to remove excess material portions and to planarize a top surface of the device 300.

The method 200 then proceeds to block 210 where a recessing process, a high-κ dielectric layer deposition process, and a CMP process are performed. Referring to the example of FIGS. 6 and 7, in an embodiment of block 210, a recessing process is performed to remove top portions of the dielectric layers 602 and 604. In some embodiments, the recessing process may include a dry etching process, a wet etching process, and/or a combination thereof. In some embodiments, a recessing depth is controlled (e.g., by controlling an etching time) to result in a desired recess depth 'D'. In some cases, the recessing process may optionally remove at least part of the dielectric cap layer 502. After performing the recessing process, and in a further embodiment of block 210, a high-κ dielectric layer 702 is deposited within trenches formed by the recessing process. In some embodiments, the high-κ dielectric layer 702 may include $HfO_2$, $ZrO_2$, HfAlOx, HfSiOx, $Y_2O_3$, $Al_2O_3$, or another high-κ material. The high-κ dielectric layer 702 may be deposited by a CVD process, an ALD process, a PVD process, and/or other suitable process. After deposition of the high-κ dielectric layer 702, and in a further embodiment of block 210, a CMP process is performed to remove excess material portions and to planarize a top surface of the device 300. In some examples, the CMP process removes a portion of the dielectric cap layer 502 from the top of the fins 402 to expose the nitride layer 312A. Thus, in various cases, a hybrid fin 706 is defined as having a lower portion including the recessed portions of the dielectric layers 602, 604 and an upper portion including the high-κ dielectric layer 702. In some examples, a height 'H1' of the high-κ dielectric layer 702 may be about 10-30 nm. It is noted that the height 'H1' may be defined by the recess depth 'D', and a height 'H1' greater than about 30 nm may not provide significant advantage. For example, a recess depth 'D' greater than about 30 nm, and thus a height 'H1' greater than about 30 nm, could result in the high-κ dielectric layer 702 being directly adjacent to channel layers of the device 300 (e.g., the epitaxial layer portions 308A). In such cases, the high-κ dielectric layer 702 may cause parasitic coupling between channel layers of adjacent fins, thereby degrading device performance. It is further noted that if the height 'H1' is less than about 10 nm, the high-κ dielectric layer 702 may not be sufficiently thick to endure a subsequent etch process (e.g., such as the active region isolation etch process of block 230). In some cases, the hybrid fins 706 may be alternatively described as a bi-layer dielectric having a high-κ upper portion and a low-κ lower portion. In some examples, a height ratio of the upper portion to the lower portion may be about 1/20-20/1. The height ratio may be adjusted, for example, by changing the recess depth 'D' (and thus the height 'H1'), as noted above. In some embodiments, the hybrid fins 706 (with the high-κ upper portion), or the hybrid fins 606 (without the high-κ upper portion) may be used to effectively prevent the undesirable lateral merging of the source/drain epi-layers formed on adjacent fins, as discussed in more detail below. As also shown in FIG. 7, one of the hybrid fins 706 is denoted as hybrid fin 706", where the hybrid fin 706" has the width 'W1' and corresponds to the hybrid fin 106" of FIG. 1, and another of the hybrid fins 706 is denoted as hybrid fin 706', where the hybrid fin 706' has the width 'W2' and corresponds to the hybrid fin 106' of FIG. 1.

Figure 9:
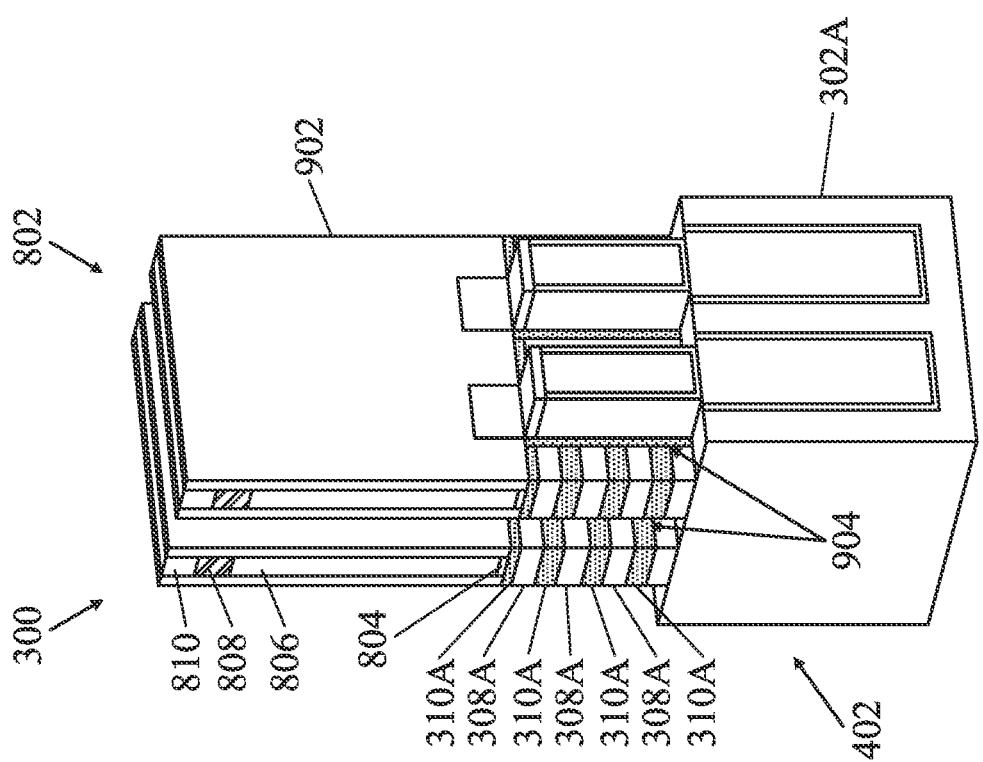

The method 200 then proceeds to block 212 where a dummy gate structure is formed. While the present discussion is directed to a replacement gate (gate-last) process whereby a dummy gate structure is formed and subsequently replaced, other configurations may be possible. With reference to FIGS. 7, 8, and 9, in an embodiment of block 212, the nitride layer 312A and portions of the dielectric cap layer 502 may initially be etched-back such that top surfaces of the etched-back dielectric cap layer 502 are substantially level with top surfaces of the topmost epitaxial layer portion 310A of the fins 402. In some embodiments, the etch-back of the nitride layer 312A and the portions of the dielectric cap layer 502 may be performed using a wet etch process, a dry etch process, a multiple-step etch process, and/or a combination thereof. After performing the etch-back process, and in a further embodiment of block 212, gate stacks 802 are formed over the fins 402 and over the hybrid fins 706, including over the top surfaces of the etched-back dielectric cap layer 502 and over the top surfaces of the topmost epitaxial layer portion 310A of the fins 402. In an embodiment, the gate stacks 802 are dummy (sacrificial) gate stacks that are subsequently removed and replaced by the final gate stack at a subsequent processing stage of the device 300, as discussed below. The gate stacks 802 may be replaced at a later processing stage by a high-κ dielectric layer (HK) and metal gate electrode (MG). In some embodiments, the gate stacks 802 are formed over the substrate 302 and are at least partially disposed over the fins 402 and the hybrid fins 706. The portion of the fins 402 underlying the gate stacks 802 may be referred to as the channel region. The gate stacks 802 may also define a source/drain region of the fins 402, for example, the regions of the fins 402 adjacent to and on opposing sides of the channel region.

In some embodiments, the gate stacks 802 include a dielectric layer 804 and an electrode layer 806. The gate stacks 802 may also include one or more hard mask layers 808, 810. In some embodiments, the hard mask layer 808 may include a nitride layer (e.g., such as SiN), and the hard mask layer 810 may include an oxide layer. In some embodiments, the gate stacks 802 are formed by various process steps such as layer deposition, patterning, etching, as well as other suitable processing steps. In some examples, the layer deposition process includes CVD (including both low-pressure CVD and/or plasma-enhanced CVD), PVD, ALD, thermal oxidation, e-beam evaporation, or other suitable deposition techniques, or a combination thereof. In forming the gate stacks 802 for example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods.

In some embodiments, the dielectric layer 804 includes silicon oxide. Alternatively, or additionally, the dielectric layer 804 may include silicon nitride, a high-κ dielectric material or other suitable material. In some embodiments, the electrode layer 806 may include polycrystalline silicon (polysilicon). In some embodiments, the nitride of the hard mask layer 808 includes a pad nitride layer that may include $Si_3N_4$, silicon oxynitride or silicon carbide. In some embodiments, the oxide of the hard mask layer 810 includes a pad oxide layer that may include $SiO_2$.

In a further embodiment of block 212, sidewall spacers 902 are formed on sidewalls of the gate stacks 802. The sidewall spacers 902 may have a thickness of about 2-10 nm. In some examples, the sidewall spacers 902 may include a dielectric material such as silicon oxide, silicon nitride, silicon carbide, silicon oxynitride, SiCN, silicon oxycarbide, SiOCN, a low-κ material (e.g., with a dielectric constant 'κ'<7), and/or combinations thereof. In some embodiments, the sidewall spacers 902 include multiple layers, such as main spacer layers, liner layers, and the like. By way of example, the sidewall spacers 902 may be formed by conformally depositing a dielectric material over the device 300 using processes such as a CVD process, a subatmospheric CVD (SACVD) process, a flowable CVD process, an ALD process, a PVD process, or other suitable process. Following the conformal deposition of the dielectric material, portions of the dielectric material used to form the sidewall spacers 902 may be etched-back to expose portions of the fins 402 not covered by the gate stacks 802 (e.g., for example, in source/drain regions). In some examples, the etch-back process may also etch a portion of the high-κ dielectric layer 702 of the hybrid fins 706 not covered by the gate stacks 802. In some cases, the etch-back process removes portions of dielectric material used to form the sidewall spacers 902 along a top surface of the gate stacks 802, thereby exposing the hard mask layer 810 of each of the gate stacks 802. In some embodiments, the etch-back process may include a wet etch process, a dry etch process, a multiple-step etch process, and/or a combination thereof. It is noted that after the etch-back process, the sidewall spacers 902 remain disposed on sidewalls of the gate stacks 802.

The method 200 then proceeds to block 214 where a source/drain etch process is performed. With reference to FIG. 9, in an embodiment of block 214, a source/drain etch process is performed to remove portions of the fins 402 not covered by the gate stacks 802 (e.g., in source/drain regions) and that were previously exposed (e.g., during the sidewall spacer 902 etch-back process). In particular, the source/drain etch process may serve to remove the exposed epitaxial layer portions 308A, 310A in source/drain regions of the device 300 to form trenches 904 which expose underlying substrate portions 302A of the fins 402. In some embodiments, the source/drain etch process may include a dry etching process, a wet etching process, and/or a combination thereof.

Figure 10:
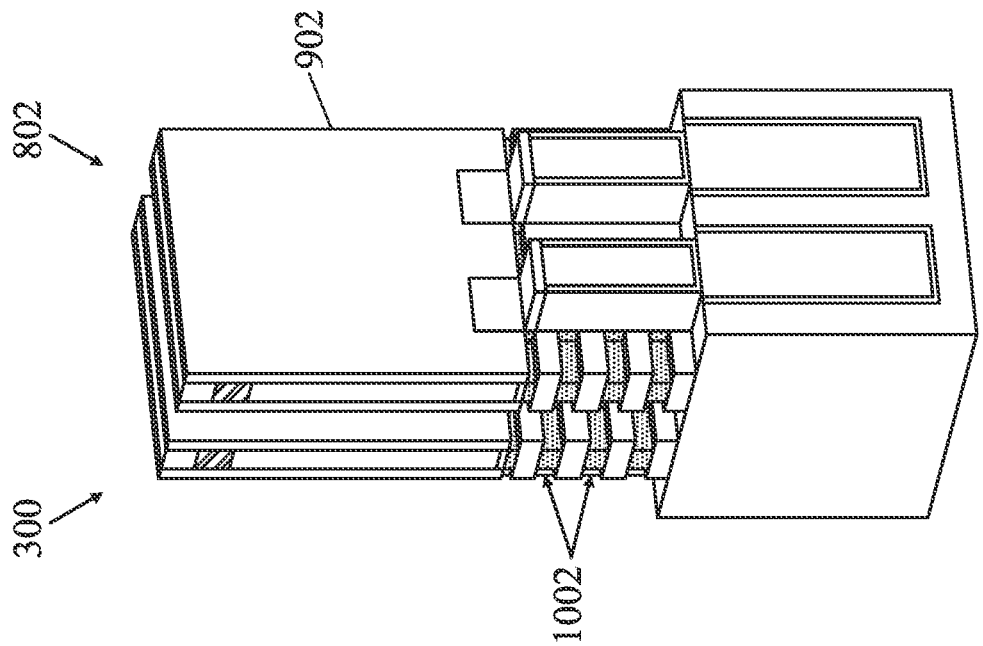
FIGS. 9, 10, 11, 12, and 13 are isometric views of some embodiments of a semiconductor device fabricated according to the method of FIG. 2.
Figure 11:
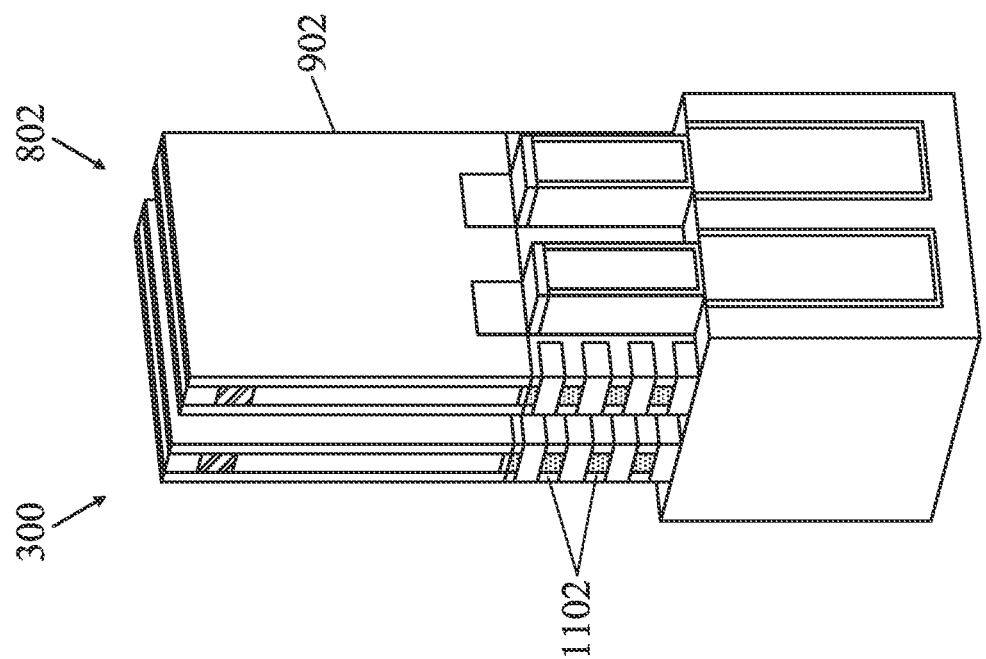

The method 200 then proceeds to block 216 where inner spacers are formed. With reference to FIGS. 9, 10, and 11, in an embodiment of block 216, inner spacers 1102 are formed. In some embodiments, formation of the inner spacers 1102 may include a lateral etch (or dielectric recess) of the epitaxial layer portions 310A (SiGe layers) to form recesses 1002, followed by deposition of a dielectric material (including within the recesses 1002), and an etch-back process to form the inner spacers 1102. In some embodiments, the inner spacers 1102 include amorphous silicon. In some examples, the inner spacers 1102 may include silicon oxide, silicon nitride, silicon carbide, silicon oxynitride, SiCN, silicon oxycarbide, SiOCN, a low-κ material (e.g., with a dielectric constant 'κ'<7), and/or combinations thereof. In various examples, the inner spacers 1102 may extend beneath the sidewall spacer 902 (formed on sidewalls of the gate stacks 802) while abutting subsequently formed source/drain features, described below.

Figure 12:
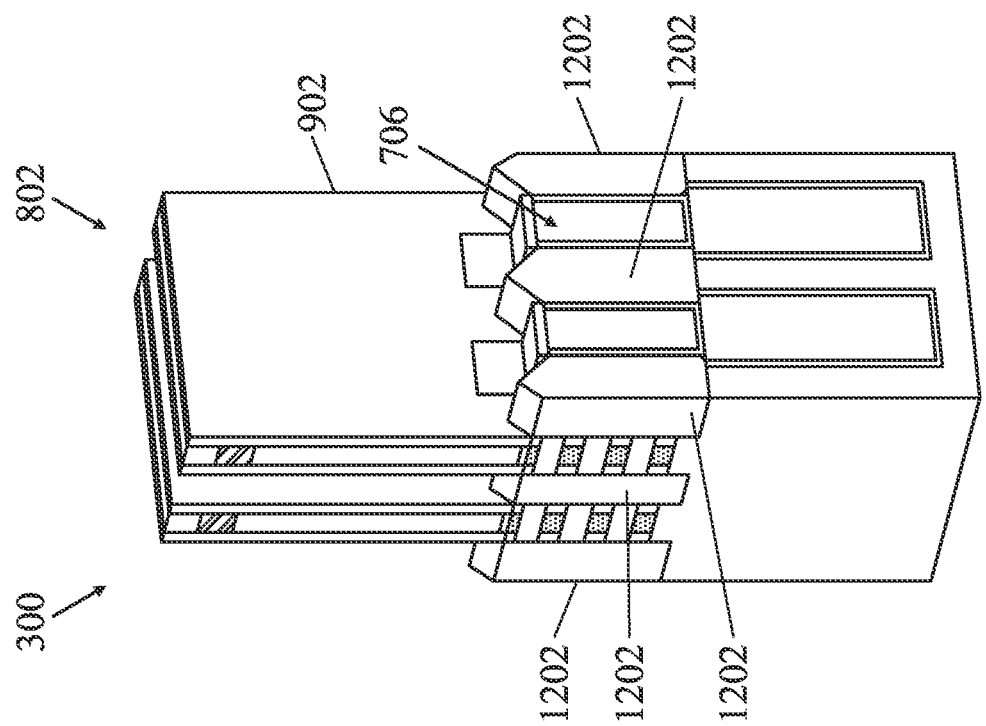

The method 200 then proceeds to block 218 where source/drain features are formed. With reference to FIGS. 11 and 12, in an embodiment of block 218, source/drain features 1202 are formed in source/drain regions adjacent to and on either side of the gate stacks 802. For example, the source/drain features 1202 may be formed within the trenches 904, over the exposed substrate portions 302A and in contact with the adjacent inner spacers 1102 and the semiconductor channel layers (the epitaxial layer portions 308A). In some embodiments, the source/drain features 1202 are formed by epitaxially growing a semiconductor material layer in the source/drain regions. In various embodiments, the semiconductor material layer grown to form the source/drain features 1202 may include Ge, Si, GaAs, AlGaAs, SiGe, GaAsP, SiP, or other suitable material. The source/drain features 1202 may be formed by one or more epitaxial (epi) processes. In some embodiments, the source/drain features 1202 may be in-situ doped during the epi process. For example, in some embodiments, epitaxially grown SiGe source/drain features may be doped with boron. In some cases, epitaxially grown Si epi source/drain features may be doped with carbon to form Si:C source/drain features, phosphorous to form Si:P source/drain features, or both carbon and phosphorous to form SiCP source/drain features. In some embodiments, the source/drain features 1202 are not in-situ doped, and instead an implantation process is performed to dope the source/drain features 1202. In some embodiments, formation of the source/drain features 1202 may be performed in separate processing sequences for each of N-type and P-type source/drain features. As illustrated in FIG. 12, the hybrid fin 706, which may have a partially etched-back high-κ dielectric layer 702, effectively prevents the undesirable lateral merging of the source/drain features 1202 formed on adjacent fins 402.

Figure 13:
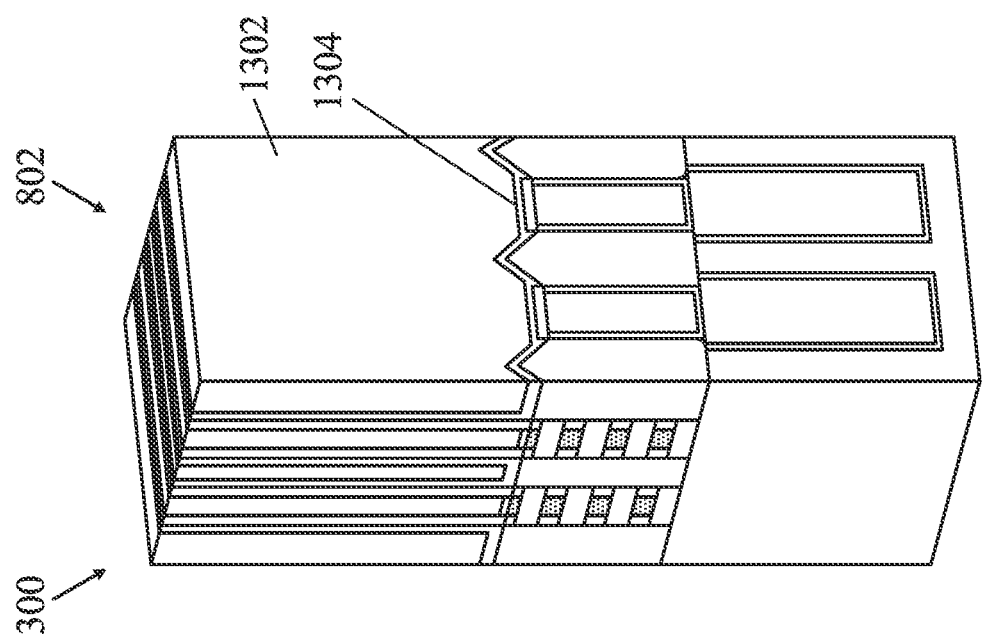

The method 200 then proceeds to block 220 where an inter-layer dielectric (ILD) layer is formed and a CMP process is performed. With reference to FIGS. 12 and 13, in an embodiment of block 220, an ILD layer 1302 is formed over the device 300. In some embodiments, a contact etch stop layer (CESL) 1304 is formed over the device 300 prior to forming the ILD layer 1302. In some examples, the CESL 1304 includes a silicon nitride layer, silicon oxide layer, a silicon oxynitride layer, and/or other materials known in the art. The CESL 1304 may be formed by a plasma-enhanced chemical vapor deposition (PECVD) process and/or other suitable deposition or oxidation processes. In some embodiments, the ILD layer 1302 includes materials such as tetraethylorthosilicate (TEOS) oxide, un-doped silicate glass, or doped silicon oxide such as borophosphosilicate glass (BPSG), fluorosilicate glass (FSG), phosphosilicate glass (PSG), boron doped silicon glass (BSG), and/or other suitable dielectric materials. The ILD layer 1302 may be deposited by a PECVD process or other suitable deposition technique. In some embodiments, after formation of the ILD layer 1302, the device 300 may be subject to a high thermal budget process to anneal the ILD layer 1302.

In a further embodiment of block 220, and after depositing the ILD layer 1302 (and/or the CESL 1304 or other dielectric layers), a planarization process may be performed to expose a top surface of the gate stacks 802. For example, a planarization process includes a CMP process which removes portions of the ILD layer 1302 (and CESL 1304, if present) overlying the gate stacks 802 and planarizes a top surface of the device 300. In addition, the CMP process may remove the hard mask layers 808, 810 overlying the gate stacks 802 to expose the underlying electrode layer 806, such as a polysilicon electrode layer, of the dummy gates.

Figures 14A, 14B:
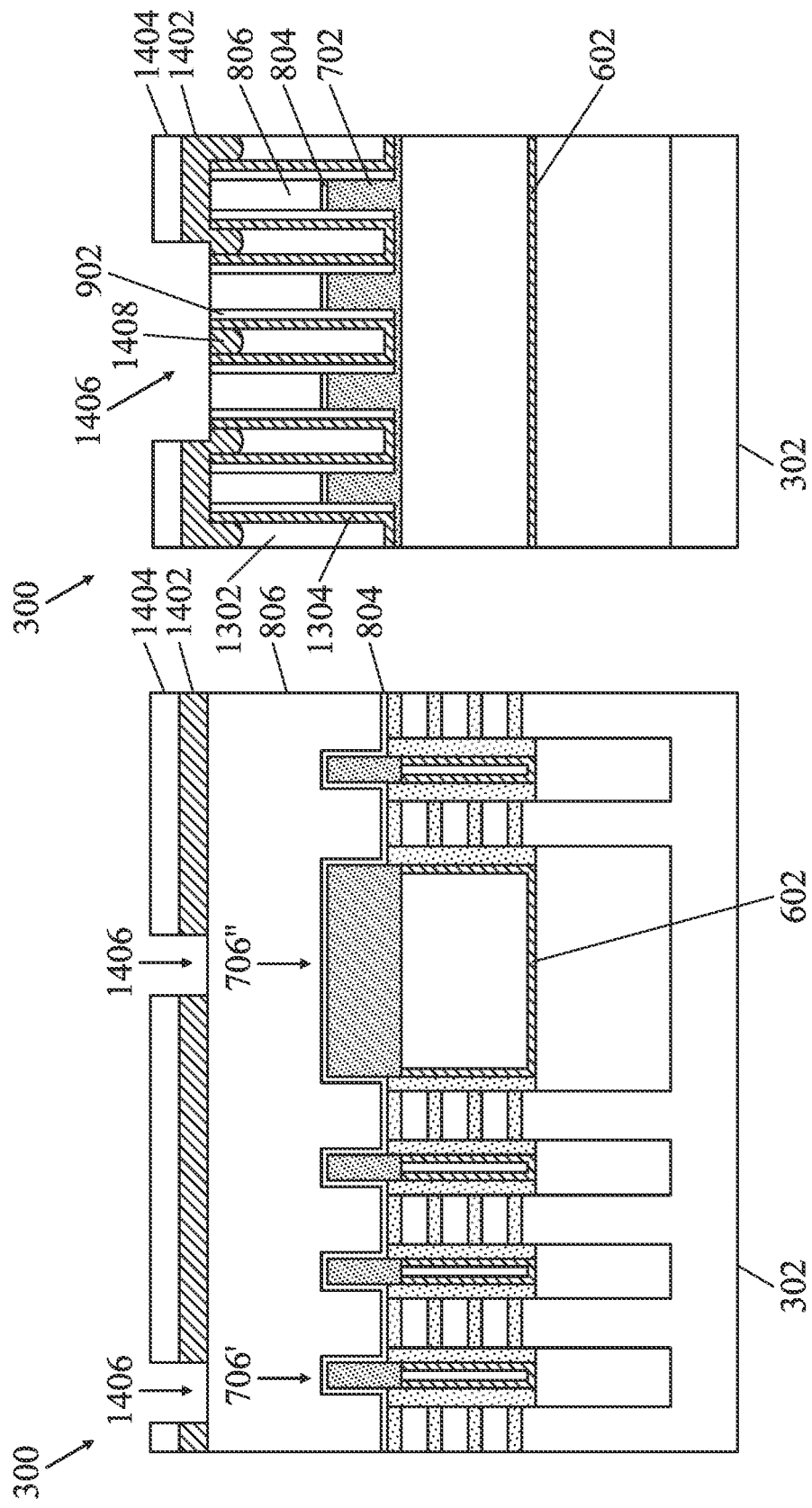

The method 200 then proceeds to block 222 where an isolation hard mask layer is deposited and patterned. With reference to FIGS. 13 and 14A/14B, in an embodiment of block 222, a hard mask (HM) layer 1402 is deposited over the electrode layer 806 of the gate stacks 802. As noted above, the CMP process of block 220 may remove the hard mask layers 808, 810 overlying the gate stacks 802 to expose the underlying electrode layer 806. Thus, the hard mask layer 1402 can be deposited directly over the electrode layer 806. In various embodiments, the HM layer 1402 includes an oxide layer (e.g., such as $SiO_2$), a nitride layer (e.g., such as a SiN layer), or a combination thereof. In some examples, the HM layer 1402 may be deposited by thermal growth, CVD, ALD, PVD, or other suitable process. The HM layer 1402 may be patterned, for example, using a photolithography process. In some embodiments, a photoresist layer is deposited over the device 300, exposed, and developed to form a patterned resist layer 1404. The patterned resist layer 1404 may then be used to pattern the underlying HM layer (e.g., using an etching process) and thereby form the patterned HM layer 1402 including openings 1406. As shown, the openings 1406 of the patterned HM layer 1402 at least partially overlap the hybrid fins 706' and 706", which correspond to the hybrid fins 106' and 106", respectively, of FIG. 1. The patterned HM layer 1402 thus also defines metal gate isolation regions (e.g., the CMG regions 110 of FIG. 1) that are used to provide the self-aligned active region isolation and/or the self-aligned CMG isolation, as described herein.

FIG. 14B also illustrates a sacrificial hard mask layer 1408 that may be formed, in some embodiments, after deposition of the ILD layer 1302 and CMP process (block 220). For example, after the ILD layer 1302 deposition and CMP process, an ILD recess process may be performed to recess the ILD layer 1302 (e.g., using a dry etch, wet etch, or combination thereof), followed by deposition of the sacrificial hard mask layer 1408, and another CMP process to remove excess material and planarize a top surface of the device 300. In some embodiments, the sacrificial hard mask layer 1408 may include SiN, SiOCN, SiCN, SiC, or a metal oxide such as $HfO_2$, $ZrO_2$, YOx, LaOx, HfAlOx, HfSiOx or $Al_2O_3$. In various cases, the sacrificial hard mask layer 1408 provides protection during active region isolation and gate isolation etch processes.

The method 200 then proceeds to block 224 where a first dummy gate etch process is performed. With reference to FIGS. 14A/14B and 15A/15B, in an embodiment of block 224, portions of the electrode layer 806 of the gate stacks 802 are etched through the openings 1406 in the patterned HM layer 1402 to form trenches 1502. In various examples, the etching process used to form the trenches 1502 includes a wet etch, a dry etch, or a combination thereof. As shown, the etching process and formation of the trenches 1502 may expose the dielectric layer 804 of the gate stacks 802 over portions of the hybrid fins 706' and 706". In some embodiments, a sidewall of the trench 1502 disposed over the hybrid fin 706' may be substantially aligned with a lateral surface of the high-κ dielectric layer 702 of the hybrid fin 706', as shown. In some cases, the etching process may additionally etch the dielectric layer 804. Thus, the dummy gate etch process of block 224 effectively transfers the pattern of the metal gate isolation region from the patterned HM layer 1402 to the electrode layer 806 and cuts the dummy gate along the CMG regions.

Figures 15A, 15B:
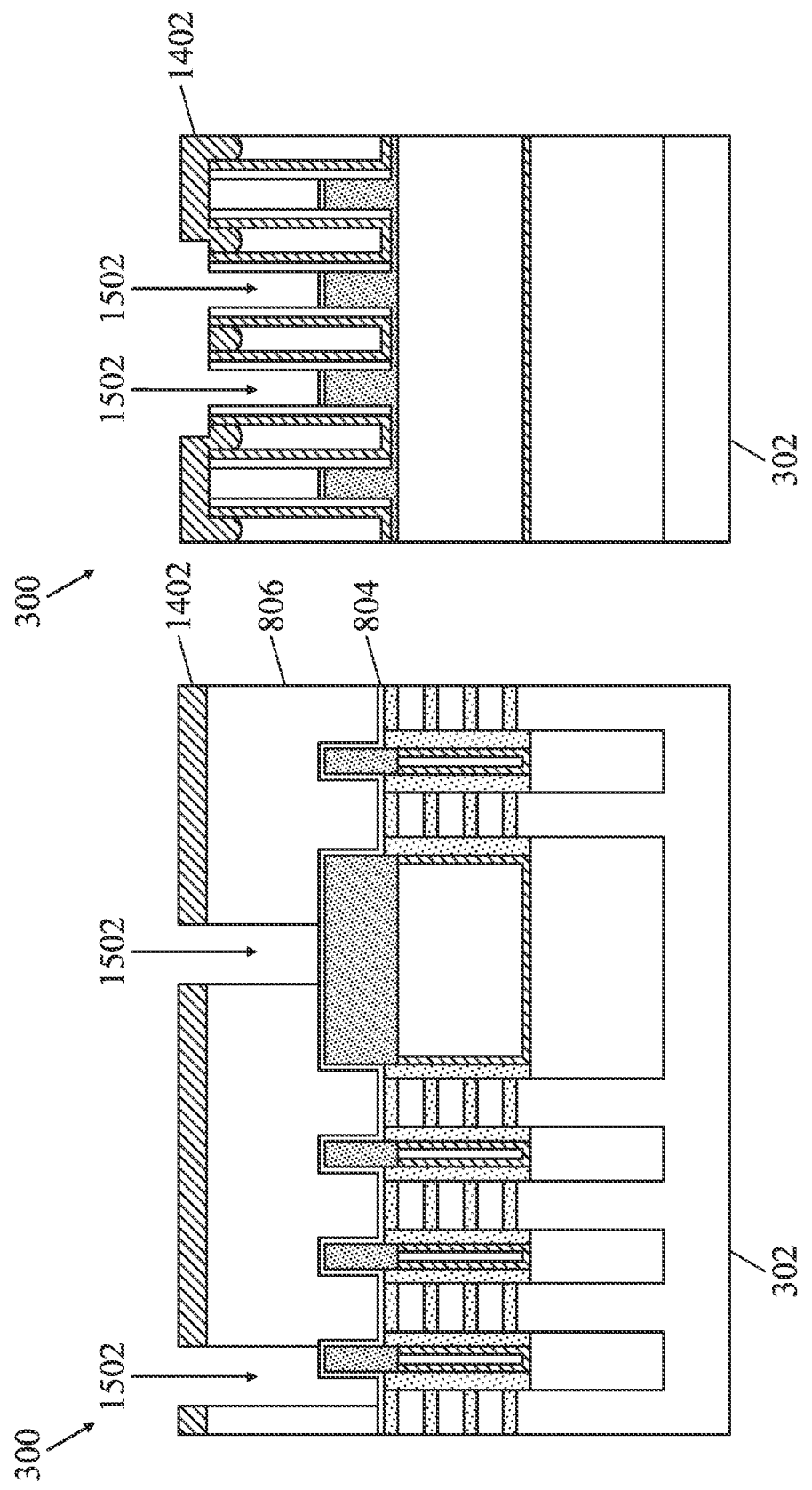

The method 200 then proceeds to block 226 where a nitride refill process is performed. With reference to FIGS. 15A/15B and 16A/16B, in an embodiment of block 226, a dielectric layer 1602 may be deposited within the trenches 1502 formed by the dummy gate etch process (block 224). Thus, the dielectric layer 1602 is formed over portions of the hybrid fins 706' and 706". In some examples, a sidewall of the dielectric layer 1602 disposed over the hybrid fin 706' may be substantially aligned with a lateral surface of the high-κ dielectric layer 702 of the hybrid fin 706', as shown. In some embodiments, the dielectric layer 1602 includes a nitrogen-containing layer. Thus, in some cases, the dielectric layer 1602 may be referred to as a nitride layer. The dielectric layer 1602 may be deposited by ALD, CVD, PVD, or other appropriate process. In some cases, after depositing the dielectric layer 1602, a CMP process may be performed to remove excess material and planarize a top surface of the device 300. It is noted that the dielectric layer 1602 may provide for protection of the self-aligned active region isolation area (e.g., during fabrication of the self-aligned active region isolation area) and may serve as a hard mask for a subsequent metal gate isolation patterning process, as discussed below.

Figures 16A, 16B:
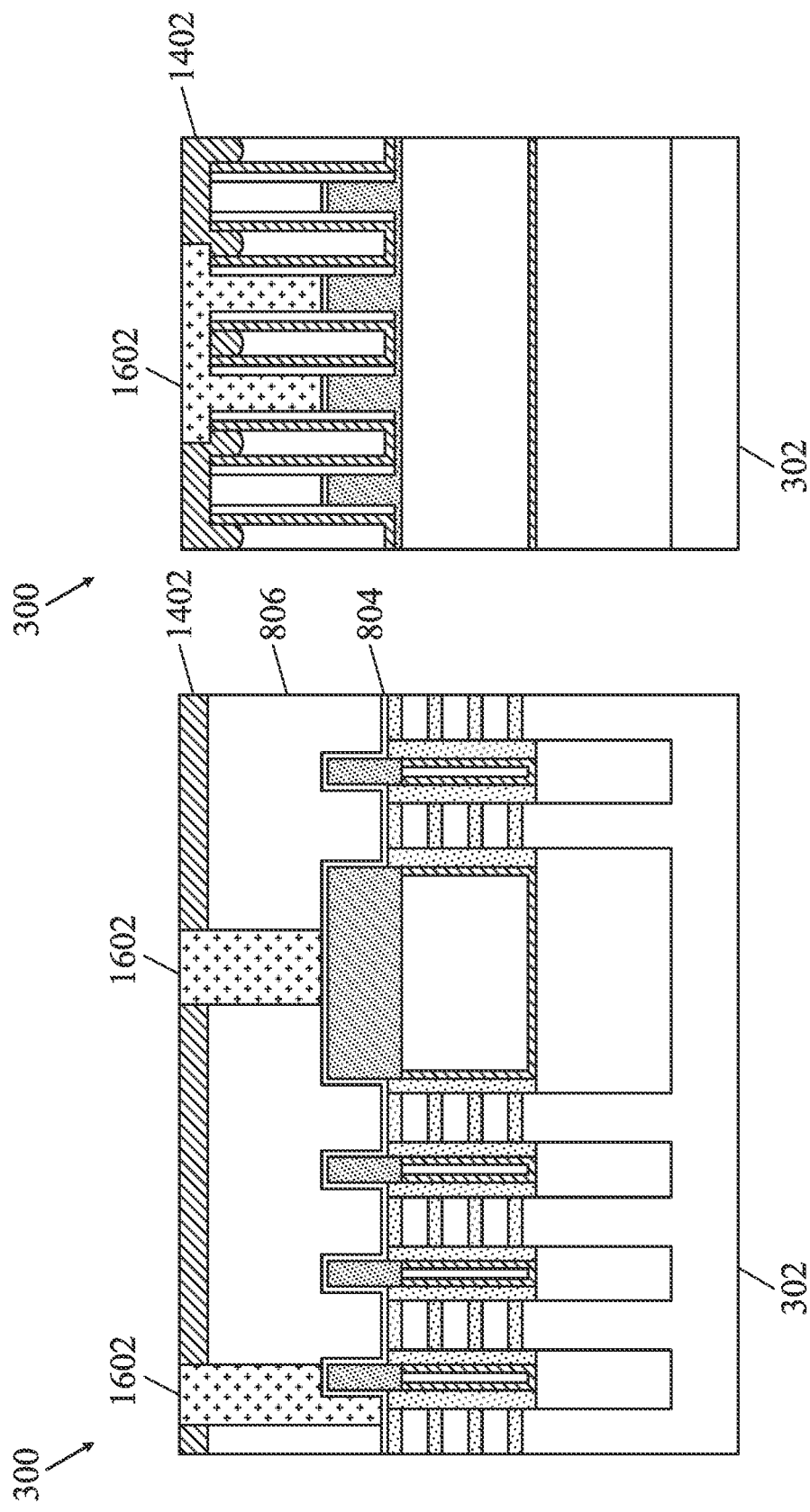

The method 200 then proceeds to block 228 where a second dummy gate etch process is performed. With reference to FIGS. 16A/16B and 17A/17B, in an embodiment of block 228, a portion of the patterned HM layer 1402 and a portion of the electrode layer 806 (both of which are disposed between the dielectric layers 1602 formed over each of the hybrid fins 706' and 706") are etched to form a trench 1702. In various examples, the etching process used to form the trench 1702 includes a wet etch, a dry etch, or a combination thereof. As shown, the etching process and formation of the trench 1702 may expose the dielectric layer 804 over portions of the hybrid fins 706' and 706", as well as over the hybrid fins 706 that are disposed between the hybrid fins 706' and 706". In some cases, the etching process may additionally etch the dielectric layer 804. In various embodiments, the area of the trench 1702 substantially corresponds to and thus provides the active region isolation area 112 of FIG. 1. To be sure, in some embodiments, the active region isolation area may extend beyond the boundaries of the trench 1702 and at least partially overlap the dielectric layers 1602.

Figures 17A, 17B:
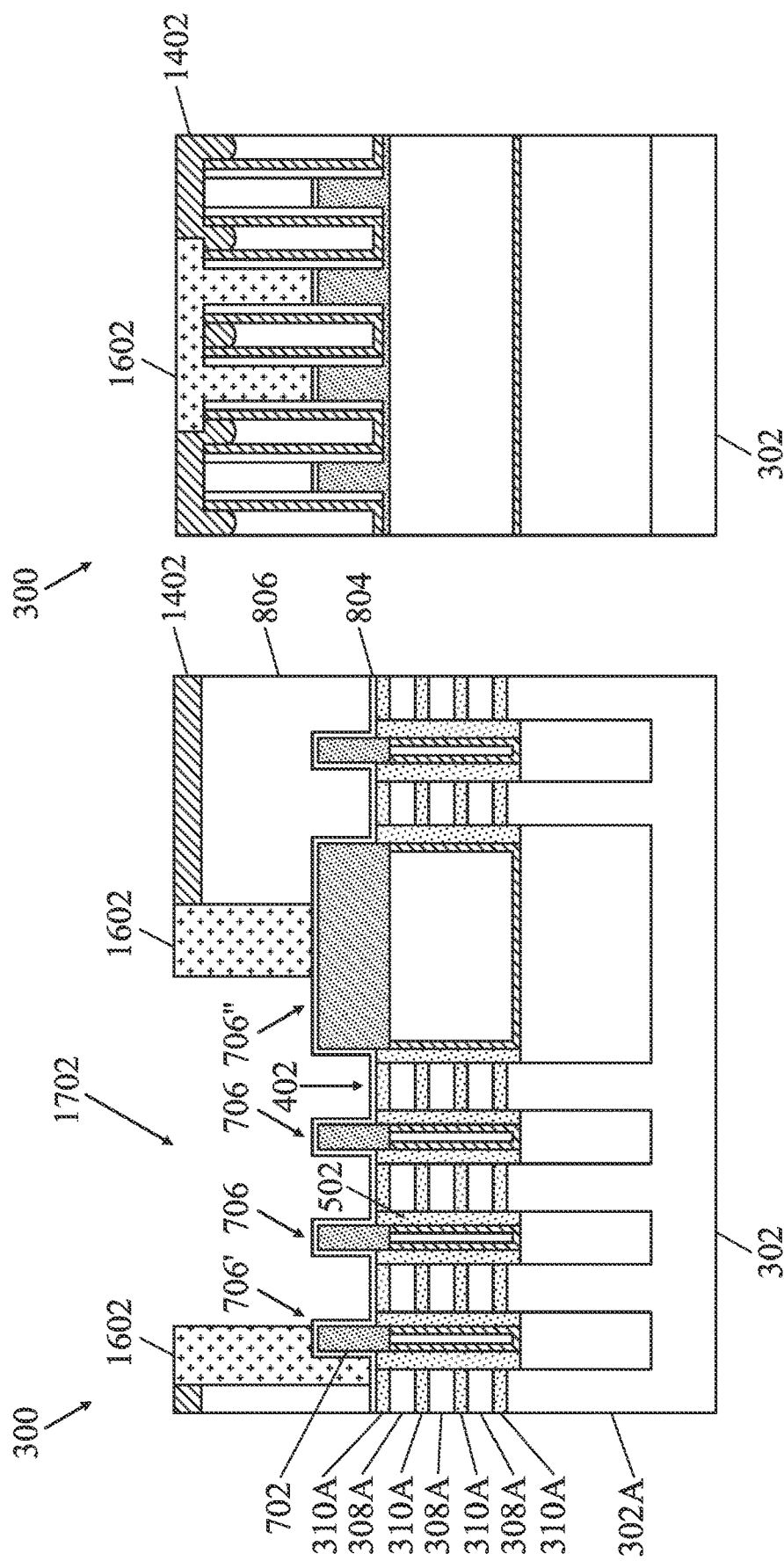

The method 200 then proceeds to block 230 where an active region isolation etch process is performed. With reference to FIGS. 17A/17B and 18A/18B, in an embodiment of block 230, an active region isolation etch process may be used to form trenches 1802 within an active region isolation area (e.g., such as the active region isolation area 112). As shown, the active region isolation etch process can be used to remove the dielectric layer 804 and the etched-back dielectric cap layer 502 from within the trench 1702. In addition, the active region isolation etch process removes the fins 402 disposed within the trench 1702, including the substrate portions 302A, the epitaxial layer portions 310A, and the epitaxial layer portions 308A of each of the fins 402. Removal of each of these layers and formation of the trenches 1802 may be performed using a wet etch process, a dry etch process, a multiple-step etch process, and/or a combination thereof. In some embodiments, and during the active region isolation etch process, the dielectric layer 1602 may protect the self-aligned active region isolation area (e.g., the area of the trench 1702 that corresponds to the active region isolation area 112) and prevent undesirable etching outside of the area of the trench 1702. In various examples, remaining portions of the patterned HM layer 1402 may also serve to prevent etching in regions outside of the area of the trench 1702. It is also noted that the active region isolation etch process may recess portions of the high-κ dielectric layer 702 of the hybrid fins 706 that remain disposed within the trench 1702, as well as at least at least part of the high-κ dielectric layer 702 of the hybrid fin 706", by a recess height 'H2'. It is noted that the recessed part of the high-κ dielectric layer 702 of the hybrid fin 706" may form a curved, non-planar corner 1804 on the high-κ dielectric layer 702 of the hybrid fin 706". In some embodiments, the recess height 'H2' may be greater than about 2 nm. It is noted that, in some embodiments, the height loss of about 2 nm of the high-κ dielectric layer 702 may largely be an unintentional consequence of the active region isolation etch process. However, because the height 'H1' of the high-κ dielectric layer 702 is about 10-30 nm, as discussed above, the high-K dielectric layer 702 is able to endure the approximately 2 nm height loss caused by the active region isolation etch process. In some cases, and due to a sidewall of the dielectric layer 1602 being substantially aligned with the lateral surface of the high-κ dielectric layer 702 of the hybrid fin 706' (thus protecting the hybrid fin 706'), the active region isolation etch process may not substantially etch and/or recess portions of the high-κ dielectric layer 702 of the hybrid fin 706'. However, in some embodiments, at least a portion of the high-κ dielectric layer 702 of the hybrid fin 706' may be etched and/or recessed.

Figures 18A, 18B:
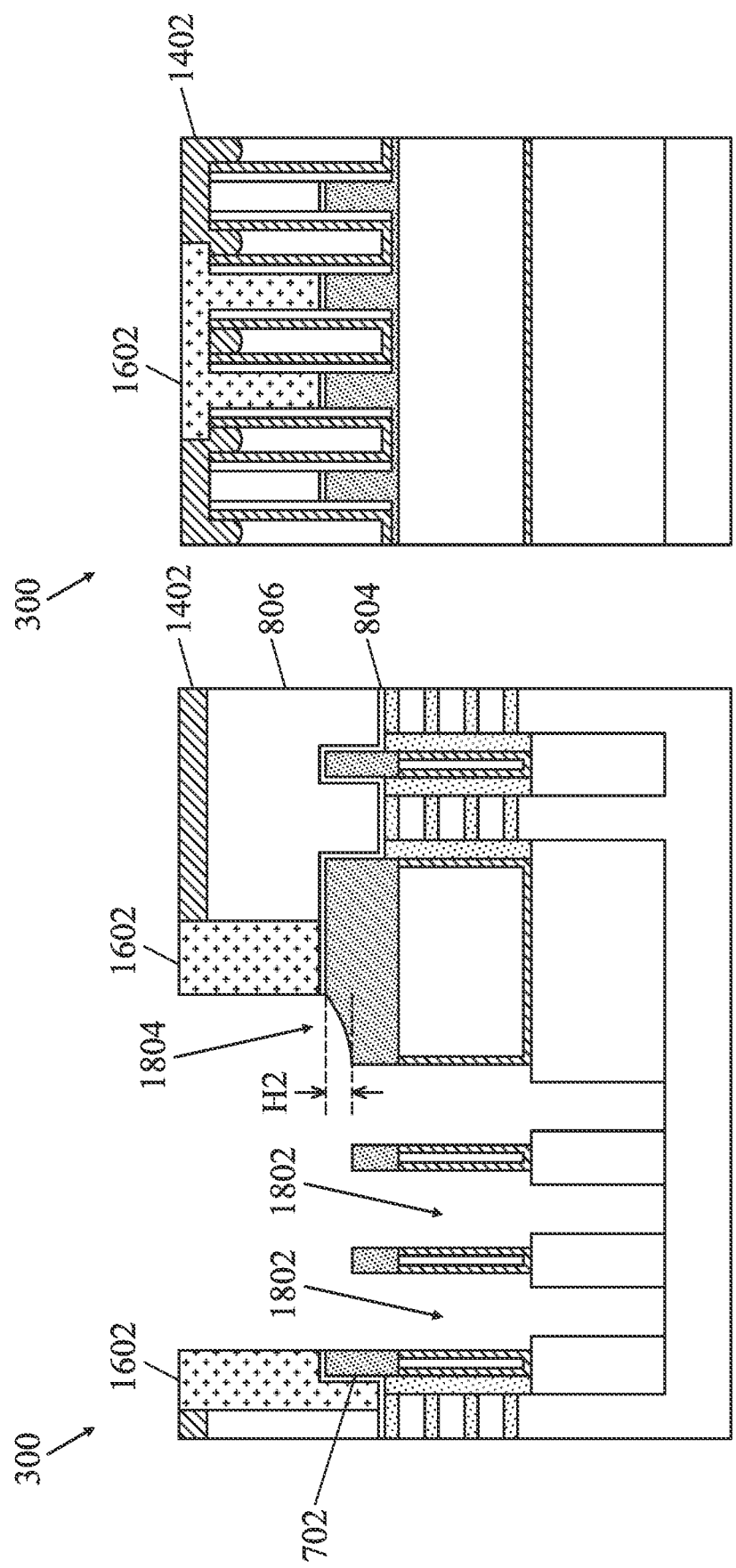

The method 200 then proceeds to block 232 where a dielectric refill process is performed. With reference to FIGS. 18A/18B and 19A/19B, in an embodiment of block 232, a dielectric layer 1902 may be deposited within the trenches 1802 formed by the active region isolation etch process (block 230). Thus, the dielectric layer 1902 is formed over the hybrid fins 706 within the active region isolation area (e.g., between the dielectric layers 1602), as well as over at least part of the hybrid fin 706" (e.g., over the recessed part of the high-κ dielectric layer 702 of the hybrid fin 706"). The dielectric layer 1902 also abuts a sidewall of the hybrid fin 706" on one end of the active region isolation area and abuts a sidewall of the hybrid fin 706' on an opposite end of the active region isolation area. As shown, the dielectric layer 1902 may further abut sidewalls of the dielectric layers 1602 disposed at opposite ends of the active region isolation area. In some embodiments, the dielectric layer 1902 includes SiN, SiCN, SiOC, SiOCN, SiON, a combination thereof, or other appropriate material. The dielectric layer 1902 may be deposited by ALD, CVD, PVD, or other appropriate process. In at least one embodiment, the dielectric layer 1902 includes multiple sub-layers with different materials. For example, the dielectric layer 1902 may include a nitrogen-containing liner along sidewalls of hybrid fins and a silicon oxide (SiOx) layer over the nitrogen-containing liner. In some cases, after depositing the dielectric layer 1902 and in a further embodiment of block 232, a CMP process may be performed to remove excess material and planarize a top surface of the device 300. In some examples, the CMP process removes remaining portions of the patterned HM layer 1402 to expose remaining portions of the electrode layer 806. Additionally, and as a result of the CMP process, top surfaces of the electrode layer 806, the dielectric layers 1602, and the dielectric layer 1902 may be substantially level with each other.

Figures 19A, 19B:
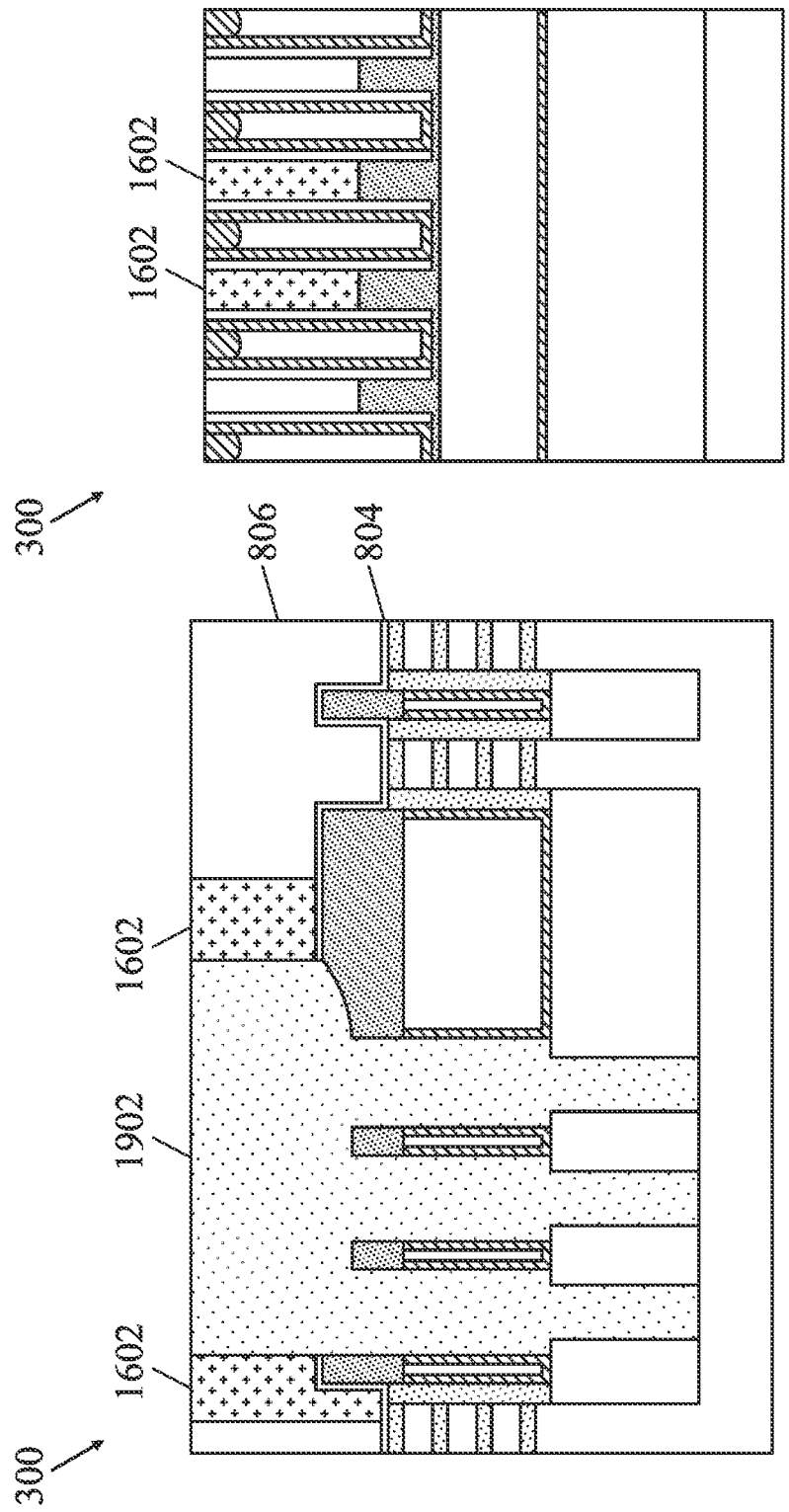

The method 200 then proceeds to block 234 where a third dummy gate etch process is performed. With reference to FIGS. 19A/19B and 20A/20B, in an embodiment of block 234, remaining portions of the electrode layer 806 (e.g., exposed during the CMP process of block 232) are partially removed to form trenches 2002, 2004 that include recessed electrode layer portions 806A. The recessed electrode layer portions 806A may serve at least in part to protect the underlying fins 402, which are disposed in active regions outside of the active region isolation area and outside of the CMG isolation area. In various examples, the etching process used to form the trenches 2002, 2004 includes a wet etch, a dry etch, or a combination thereof. As shown, the etching process and formation of the trench 2004, in particular, may expose the dielectric layer 804 over a portion of the hybrid fin 706" in a region 2006, as well as over a hybrid fin 706 disposed within a gate connection area 2008. In some cases, the third dummy gate etching process may also etch exposed portions of the dielectric layer 804.

The method 200 then proceeds to block 236 where a high-κ layer etch process is performed. With reference to FIGS. 20A/20B and 21A/21B, in an embodiment of block 236, a portion of the hybrid fin 706" in the region 2006 and a portion of the hybrid fin 706 in the gate connection area 2008, exposed by the third dummy gate etch process of block 234, are etched. For example, portions of the high-κ dielectric layer 702 (including portions of the dielectric layer 804 formed thereon) may be substantially removed from the portion of the hybrid fin 706" in the region 2006 and from the hybrid fin 706 in the gate connection area 2008. As shown, the high-κ layer etch process may expose a top surface of the dielectric layers 602, 604 in the region 2006 and in the gate connection area 2008. In particular, the high-κ dielectric layer 702 may be completely removed from the hybrid fin 706 in the gate connection area 2008 to provide a hybrid fin 706A without the high-κ upper portions (e.g., similar to the hybrid fins 606, discussed above). In some embodiments, the high-κ layer etch process may further recess, but not completely remove, the electrode layer portions 806A and the dielectric layer 804 in regions over the fins 402. Thus, the underlying fins 402 (including the epitaxial layer portions 308A and the epitaxial layer portions 310A) remain protected. In various examples, the high-κ layer etch process includes a wet etch, a dry etch, or a combination thereof. It is noted that the high-κ layer etch process of block 236 is self-aligned to the dielectric layer 1602. As previously noted, the dielectric layer 1602 may serve as a hard mask for a metal gate isolation patterning process. Thus, in various embodiments, the high-κ layer etch process of block 236 may be referred to as a self-aligned metal gate isolation patterning process which uses the dielectric layer 1602 as a hard mask. The metal gate isolation effect of the metal gate isolation patterning process will become more evident in the discussion that follows.

The method 200 proceeds to block 238 where a fourth dummy gate etch and a channel release process are performed. Referring to the example of FIGS. 21A/21B and 22A/22B, in an embodiment of block 238, the electrode layer portions 806A and the dielectric layer 804 in regions over the fins 402 (e.g., remaining after the high-κ layer etch process of block 236) may be removed by a suitable etching process, thereby exposing underlying epitaxial layers of the fins 402. In some examples, the etching process may also remove the dielectric layers 1602 and portions of the dielectric layer 804 disposed below the dielectric layer 1602. In various embodiments, the etching process may include a wet etch, a dry etch, a multiple-step etch process, or a combination thereof. After removal of the electrode layer portions 806A, the dielectric layers 1602, and the dielectric layer 804, and in a further embodiment of block 238, a selective removal of the SiGe layers (including the etched-back dielectric cap layer 502 and the epitaxial layer portions 310A) in the channel regions of each of the fins 402 of the device 300 is performed. In various examples, the SiGe layers (including the etched-back dielectric cap layer 502 and the epitaxial layer portions 310A) are removed from the exposed fins 402 using a selective wet etching process. In some embodiments, the selective wet etching includes ammonia and/or ozone. As merely one example, the selective wet etching includes tetra-methyl ammonium hydroxide. (TMAH). In an embodiment, the etched-back dielectric cap layer 502 and the epitaxial layer portions 310A are SiGe and the epitaxial layer portions 308A are silicon, allowing for the selective removal of the SiGe layers. It is noted after selective removal of the SiGe layers, gaps may be formed between the adjacent semiconductor channel layers in the channel region (e.g., gaps 2202 between epitaxial layer portions 308A). In some examples, selective removal of the SiGe layers, as described above, may be referred to as a semiconductor channel layer release process.

The method 200 then proceeds to block 240 where a gate structure is formed. With reference to FIGS. 22A/22B and 23A/23B, in an embodiment of block 240, a gate structure is formed over the device 300. The gate structure may include a high-κ/metal gate stack, however other compositions are possible. In some embodiments, the gate structure may form the gate associated with the multi-channels provided by the plurality of exposed semiconductor channel layers (epitaxial layer portions 308A, now having gaps 2202 there between) in the channel region of the device 300. Generally, the formation of the high-κ/metal gate stack may include depositions to form various gate materials, one or more liner layers, and one or more CMP processes to remove excessive gate materials and thereby planarize a top surface of the device 300, among other processes, as described below.

In some embodiments, a gate dielectric 2302 may initially be formed within the trenches of the device 300 provided by the removal of the dummy gate and/or by the release of the semiconductor channel layers, as described above. In various embodiments, the gate dielectric 2302 includes an interfacial layer (IL) and a high-κ gate dielectric layer formed over the interfacial layer. In some embodiments, the gate dielectric 2302 has a total thickness of about 1-5 nm. High-κ gate dielectrics, as used and described herein, include dielectric materials having a high dielectric constant, for example, greater than that of thermal silicon oxide (~3.9).

In some embodiments, the interfacial layer of the gate dielectric 2302 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The high-κ gate dielectric layer of the gate dielectric 2302 may include a high-κ dielectric layer such as hafnium oxide ($HfO_2$). Alternatively, the high-κ gate dielectric layer may include other high-κ dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The high-κ gate dielectric layer may be formed by ALD, physical vapor deposition (PVD), CVD, oxidation, and/or other suitable methods.

Figures 23A, 23B:
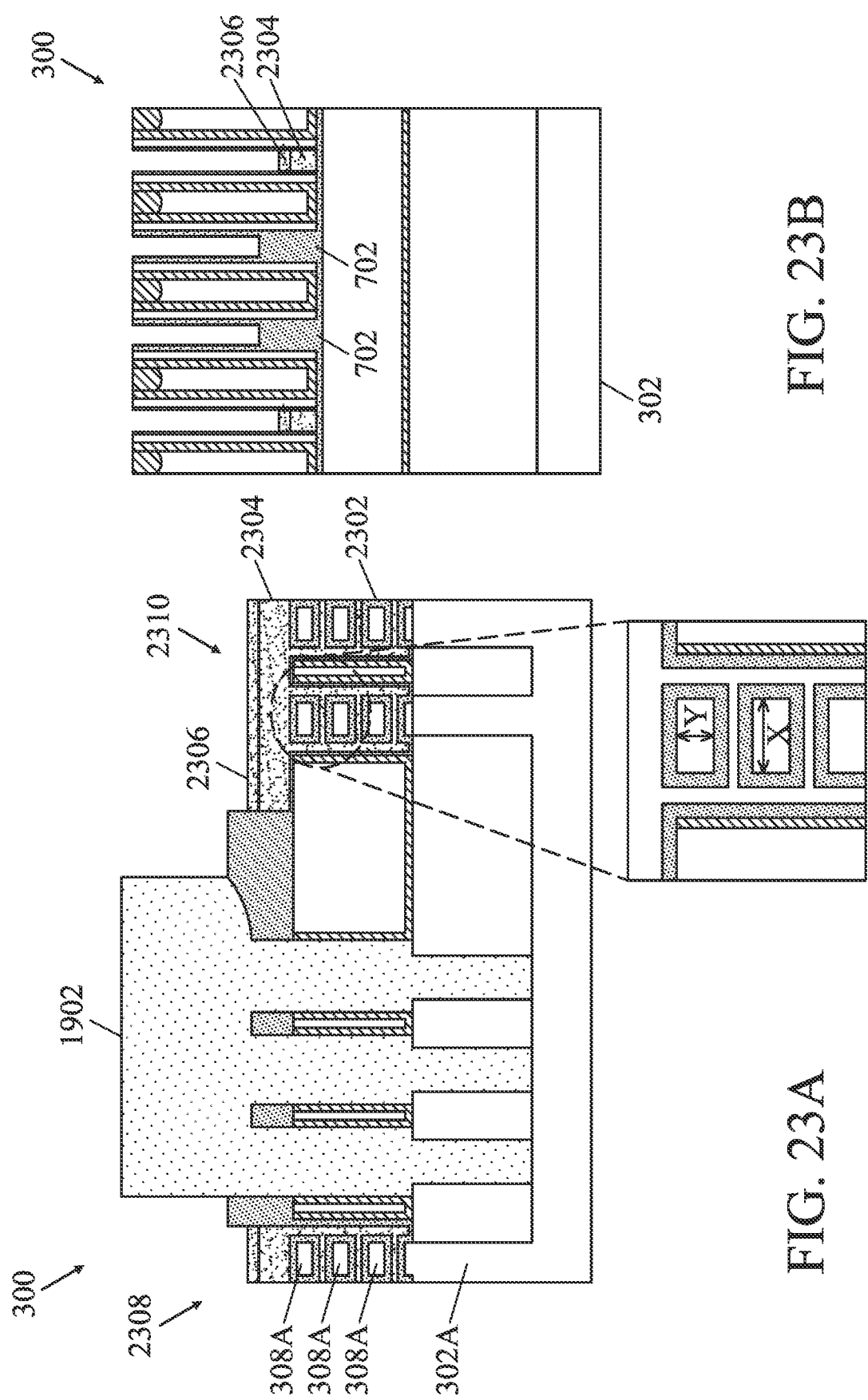
Figure 24B:
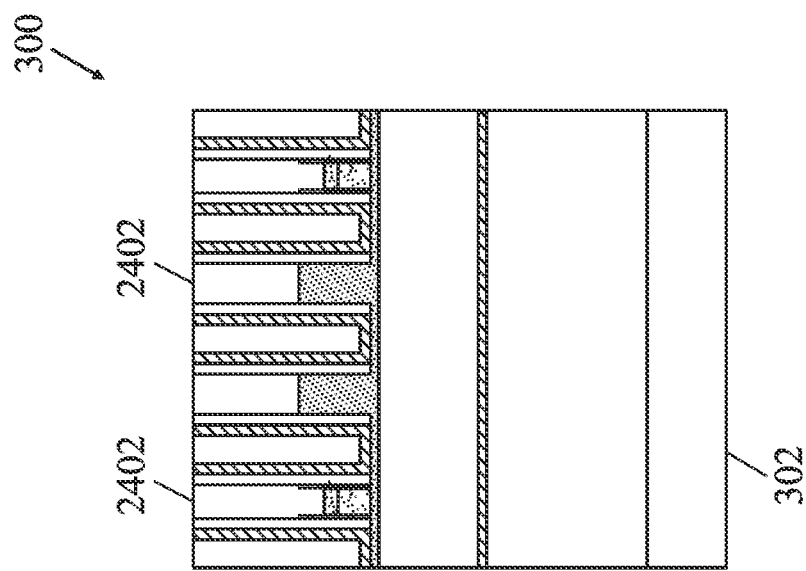
Figure 24A:
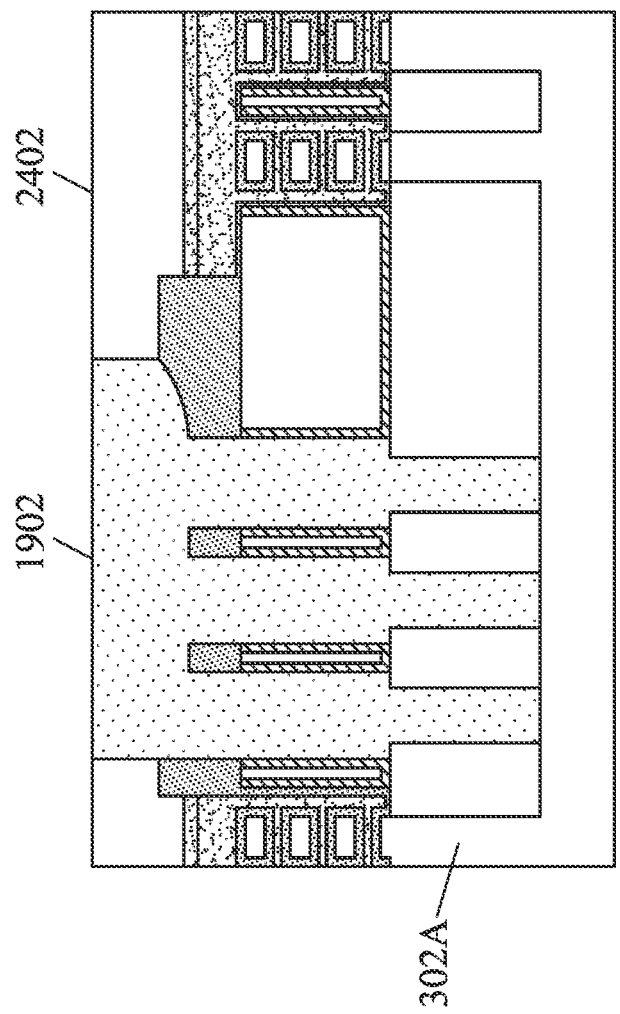

In a further embodiment of block 240, a metal gate including a metal layer 2304 is formed over the gate dielectric 2302 of the device 300. In some embodiments, the metal layer 2304 may initially be deposited over the device 300 and etched-back, as discussed below, to form the metal layer 2304 as shown in FIG. 23A. The metal layer 2304 may include a metal, metal alloy, or metal silicide. In some embodiments, the metal layer 2304 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the metal layer 2304 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In various embodiments, the metal layer 2304 may be formed by ALD, PVD, CVD, e-beam evaporation, or other suitable process. Further, the metal layer 2304 may be formed separately for N-type and P-type transistors which may use different metal layers. In addition, the metal layer 2304 may provide an N-type or P-type work function, may serve as a transistor (e.g., GAA transistor) gate electrode, and in at least some embodiments, the metal layer 2304 may include a polysilicon layer. With respect to the GAA device shown and discussed, the gate structure includes portions that interpose each of the epitaxial layer portions 308A, which each provide semiconductor channel layers for the device 300.

After formation of the metal layer 2304, and in a further embodiment of block 240, the metal layer 2304 may be etched-back and a metal layer 2306 is deposited over the etched-back metal layer 2304. In some embodiments, the metal layer 2306 includes selectively-grown tungsten (W), although other suitable metals may also be used. In at least some examples, the metal layer 2306 includes a fluorine-free W (FFW) layer. In various examples, the metal layer 2306 may serve as an etch-stop layer and may also provide reduced contact resistance (e.g., to the metal layer 2304). In particular, as a result of etching-back the metal layer 2304 (and in some cases the metal layer 2306), and because of the height 'H1' of the high-κ dielectric layer 702, a self-aligned metal gate isolation process is completed, and metal layers of adjacent structures are effectively isolated from each other. For example, metal gate structures of devices (e.g., transistors) in a region 2308 are separated from devices (e.g., transistors) in a region 2310. Stated another way, a top surface of the metal layer 2304 (or in some cases the metal layer 2306) may define a first horizontal plane, and a top surface of the high-κ dielectric layer 702 (e.g., of the hybrid fin 706") may define a second horizontal plane, and the etching-back of the metal layer 2304 (and in some cases the metal layer 2306) results in the first plane being disposed beneath the second plane.

In some embodiments, the channel regions formed by the epitaxial layer portions 308A, and which define the semiconductor channel layers, may have a variety of dimensions. For example, considering X and Y dimensions of the epitaxial layer portions 308A from an end-view of the epitaxial layer portions 308A (e.g., FIG. 23A), an 'X' dimension may be equal to about 5-100 nm, and a 'Y' dimension may be equal to about 4-8 nm. In some cases, the X dimension is substantially the same as the Y dimension. By way of example, if the X dimension is greater than the Y dimension, then the epitaxial layer portions 308A may be referred to as a "nanosheet". In some cases, a spacing/gap between adjacent semiconductor channel layers (epitaxial layer portions 308A) is equal to about 6-15 nm.

The method 200 then proceeds to block 242 where contact features are formed. With reference to the example of FIGS. 23A/23B and 24A/24B, in an embodiment of block 242, a self-aligned contact layer 2402 may be formed over the device 300, where the self-aligned contact layer 2402 may include a dielectric material such as silicon oxide, silicon nitride, silicon carbide, silicon oxynitride, combinations thereof, or another suitable material. In various embodiments, source/drain contacts are then formed to provide contact to source/drain features (e.g., such as source/drain features 1202), and vias may be formed to provide an electrical connection to the source/drain contacts. In some embodiments, a metal contact etch stop layer (MCESL) and an ILD layer may also be formed.

Generally, the semiconductor device 300 may undergo further processing to form various features and regions known in the art. For example, subsequent processing may form contact openings, contact metal, as well as various contacts/vias/lines and multilayer interconnect features (e.g., metal layers and interlayer dielectrics) on the substrate 302, configured to connect the various features to form a functional circuit that may include one or more multi-gate devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 200, and some process steps described above may be replaced or eliminated in accordance with various embodiments of the method 200. Further, while the method 200 has been shown and described as including the device 300 having a GAA transistor, it will be understood that other device configurations are possible. In some embodiments, the method 200 may be used to fabricate FinFET devices or other multi-gate devices.

With respect to the description provided herein, disclosed are methods and structures for providing a self-aligned active region and self-aligned metal gate isolation scheme to achieve extreme density scaling. In some embodiments, the disclosed structures include a dielectric layer as part of an active region isolation. The dielectric layer may interpose a plurality of dielectric hybrid fins formed within the active region isolation. By way of example, the dielectric layer may include SiN, SiCN, SiOCN, SiON, or a combination thereof. In some embodiments, the disclosed structures also include dielectric hybrid fins having a high-κ dielectric top portion for self-aligned metal gate isolation and for self-aligned active region isolation. In some cases, a height of the high-κ dielectric top portion of the dielectric hybrid fin may be about 10-30 nm. In some embodiments, the dielectric material of the high-κ dielectric top portion may include $HfO_2$, $ZrO_2$, HfAlOx, HfSiOx, $Al_2O_3$, or other appropriate material. In some cases, the device may also include the dielectric hybrid fin (having the high-κ dielectric top portion) disposed within an active region isolation area, where the high-κ dielectric top portion of such dielectric hybrid fins is shorter (e.g., due to height loss), for example, than hybrid dielectric fins outside the active region isolation area. In some embodiments, the height loss of the high-κ dielectric top portion within the active region isolation area may be greater than about 2 nm and may be due to an active region isolation etch process. In various examples, there is no high-κ dielectric top portion in a gate connection region, but only a low-κ dielectric hybrid fin (e.g., including SiN, SiCN, SiOC, SiOCN, SiON, or other appropriate material). By employing the disclosed embodiments for providing a self-aligned active region and a self-aligned CMG isolation scheme, CPP and cell height may be scaled down to provide increased device density, device isolation may be improved, and device performance is enhanced. Those of skill in the art will readily appreciate that the methods and structures described herein may be applied to a variety of other semiconductor devices to advantageously achieve similar benefits from such other devices without departing from the scope of the present disclosure.

Thus, one of the embodiments of the present disclosure described a method of fabricating a semiconductor device that includes forming a dummy gate over a plurality of fins. In some examples, the method further includes removing a first portion of the dummy gate to form a first trench that exposes a first hybrid fin of the plurality of fins and a first part of a second hybrid fin of the plurality of fins. In some embodiments, the method further includes filling the first trench with a dielectric material, where the dielectric material is disposed over the first hybrid fin and over the first part of the second hybrid fin. Thereafter, a second portion of the dummy gate may be removed to form a second trench and the second trench may be filled with a metal layer. In some embodiments, the method further includes etching-back the metal layer, where a first plane defined by a first top surface of the metal layer is disposed beneath a second plane defined by a second top surface of a second part of the second hybrid fin after the etching-back the metal layer.

In another of the embodiments, discussed is a method including forming a first nitride layer and a second nitride layer within cut metal gate regions of a dummy gate, where the first nitride layer at least partially overlaps a first hybrid fin, and where the second nitride layer at least partially overlaps a second hybrid fin. In some embodiments, the method further includes etching a trench in an active region isolation area between the first nitride layer and the second nitride layer and filling the trench with a dielectric layer. In some examples, the method further includes removing the first nitride layer, the second nitride layer, and partially removing a portion of the dummy gate outside the active region isolation area. In various embodiments, the method further includes forming a metal gate layer in a gate connection area, where an upper portion of at least one of the first hybrid fin and the second hybrid fin extends above the metal gate layer.

In yet another of the embodiments, discussed is a semiconductor device including a first active fin having a first metal gate layer and a second active fin having a second metal gate layer. In some embodiments, the semiconductor device further includes an active region isolation area disposed between the first active fin and the second active fin. In some cases, the semiconductor device further includes a first hybrid fin disposed within the active region isolation area and a second hybrid fin disposed between the active region isolation area and the second active fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
    forming a dummy gate over a plurality of fins;
    removing a first portion of the dummy gate to form a first trench that exposes a first hybrid fin of the plurality of fins and a first part of a second hybrid fin of the plurality of fins;
    filling the first trench with a first dielectric material, wherein the first dielectric material is disposed over the first hybrid fin and over the first part of the second hybrid fin;
    removing a second portion of the dummy gate to form a second trench;

filling the second trench with a metal layer; and etching-back the metal layer, wherein a first plane defined by a first top surface of the metal layer is disposed beneath a second plane defined by a second top surface of a second part of the second hybrid fin after the etching-back the metal layer.

2. The method of claim 1, further comprising:

prior to removing the first portion of the dummy gate, removing a third portion of the dummy gate to form a third trench that exposes the second part of the second hybrid fin, wherein the third portion of the dummy gate interposes the first portion of the dummy gate and the second portion of the dummy gate; and filling the third trench with a second dielectric layer.

3. The method of claim 2, further comprising:

prior to filling the second trench with the metal layer, removing the second dielectric layer.

4. The method of claim 1, further comprising:

after removing the first portion of the dummy gate and prior to filling the first trench, performing an etch process to remove a portion of an active fin disposed between the first hybrid fin and the second hybrid fin.

5. The method of claim 4, wherein the etch process recesses a first high-κ upper portion of the first hybrid fin.

6. The method of claim 5, wherein the second hybrid fin includes a second high-κ upper portion, and wherein a first height of the first high-κ upper portion is less than a second height of the second high-κ upper portion.

7. The method of claim 1, wherein the second trench exposes a third hybrid fin of the plurality of fins and an active fin disposed between the second hybrid fin and the third hybrid fin.

8. The method of claim 7, further comprising:

prior to filling the second trench with the metal layer, removing a third part of the second hybrid fin and a third high-κ upper portion of the third hybrid fin.

9. The method of claim 8, wherein the removing the third part of the second hybrid fin includes performing a metal gate isolation patterning process that is self-aligned to a second dielectric layer disposed over a second part of the second hybrid fin.

10. A method, comprising:

forming a first nitride layer and a second nitride layer within cut metal gate regions of a dummy gate, wherein the first nitride layer at least partially overlaps a first hybrid fin, and wherein the second nitride layer at least partially overlaps a second hybrid fin;

etching a trench in an active region isolation area between the first nitride layer and the second nitride layer and filling the trench with a dielectric layer;

removing the first nitride layer, the second nitride layer, and partially removing a portion of the dummy gate outside the active region isolation area; and forming a metal gate layer in a gate connection area, wherein an upper portion of at least one of the first hybrid fin and the second hybrid fin extends above the metal gate layer.

11. The method of claim 10, further comprising:

prior to removing the first nitride layer and the second nitride layer, and after partially removing the portion of the dummy gate outside the active region isolation area, performing a metal gate isolation patterning process that removes part of a first high-κ upper portion of the second hybrid fin disposed outside of the active region isolation area.

12. The method of claim 11, wherein the partially removing the portion of the dummy gate exposes a fourth hybrid fin disposed outside of the active region isolation area, and wherein the metal gate isolation patterning process removes a second high-κ upper portion of the fourth hybrid fin.

13. The method of claim 12, further comprising:

after performing the metal gate isolation patterning process, removing a remaining portion of the dummy gate outside the active region isolation area; and after removing the remaining portion of the dummy gate, forming the metal gate layer in the gate connection area.

14. The method of claim 10, wherein the etching the trench recesses an upper portion of a third hybrid fin disposed within the active region isolation area, and wherein the etching the trench removes an active fin disposed within the active region isolation area.

15. The method of claim 14, wherein the first hybrid fin includes a first high-κ upper portion, wherein the second hybrid fin includes a second high-κ upper portion, wherein the upper portion of the third hybrid fin includes a third high-κ upper portion, and wherein the third high-κ upper portion is recessed as compared to the first and second high-κ upper portions.

16. A semiconductor device, comprising:

a first active fin including a first metal gate layer and a second active fin including a second metal gate layer;

an active region isolation area disposed between the first active fin and the second active fin;

a first hybrid fin disposed within the active region isolation area; and a second hybrid fin disposed between the active region isolation area and the second active fin.

17. The semiconductor device of claim 16, wherein the first hybrid fin includes a first high-κ upper portion having a first height, and wherein the second hybrid fin includes a second high-κ upper portion having a second height greater than the first height.

18. The semiconductor device of claim 16, wherein a first top surface of the first metal gate layer and the second metal gate layer define a first plane, wherein a second top surface of the second hybrid fin defines a second plane, and wherein the first plane is disposed beneath the second plane.

19. The semiconductor device of claim 16, wherein the first hybrid fin has a first width, and wherein the second hybrid fin has a second width greater than the first width.

20. The semiconductor device of claim 16, further comprising:

a third hybrid fin, wherein the second active fin is disposed between the second hybrid fin and the third hybrid fin, and wherein the third hybrid fin lacks a high-κ upper portion.

* * * * *